United States Patent [19]
Yamazaki

[11] Patent Number: 4,633,287
[45] Date of Patent: Dec. 30, 1986

[54] SEMICONDUCTOR PHOTOELECTRIC CONVERSION DEVICE

[75] Inventor: Shunpei Yamazaki, Tokyo, Japan

[73] Assignee: Semiconductor Energy Laboratory Co., Ltd., Japan

[21] Appl. No.: 521,546

[22] Filed: Aug. 9, 1983

[30] Foreign Application Priority Data

Aug. 9, 1982 [JP] Japan .................. 57-138225
Aug. 13, 1982 [JP] Japan .................. 57-141500

[51] Int. Cl.$^4$ ............... H01L 27/14; H01L 31/00
[52] U.S. Cl. ............... 357/30; 136/255; 357/2; 357/15; 357/16; 357/34
[58] Field of Search ........... 357/30, 15, 2, 51, 58, 357/34, 16, 35, 30 E, 30 H, 30 A, 30 D, 36; 136/255

[56] References Cited

U.S. PATENT DOCUMENTS 4,151,006  4/1979  DeGraaff et al. ............ 357/34
4,341,954  7/1982  Mizushima ................... 357/16

FOREIGN PATENT DOCUMENTS 0061063  5/1980  Japan ................... 357/15 M

*Primary Examiner*—James W. Davie
*Assistant Examiner*—Georgia Y. Epps
*Attorney, Agent, or Firm*—Gerald J. Ferguson, Jr.; Michael P. Hoffman; James E. Bryan

[57] ABSTRACT

An $N^+N^-$(or I)PIN or $P^+P^-$(or I)NIP type photo transistor comprises semiconductor layers serving as collector, base and emitter regions and a semiconductor layer which is disposed between the semiconductor layers serving as the base and emitter regions and serves as a photo carrier generating regions. The semiconductor layers serving as the photo carrier generating region and emitter regions are both formed of a non-single-crystal semiconductor. By replacing the semiconductor layer serving as the emitter region in the $N^+N^-$(or I)PIN or $P^+P^-$(I)NIP type photo transistor with a conductive layer which makes Schottky contact with the non-single-crystal semiconductor layer as the photo carrier generating region, a Schottky junction type photo transistor is obtained. By replacing the above said conductive layer with conductive layer which is disposed on the non-single-crystal semiconductor layer as the photo carrier generating region through a barrier film which permits flowing therethrough of tunnel current, a tunnel type photo transistor is constituted.

124 Claims, 31 Drawing Figures

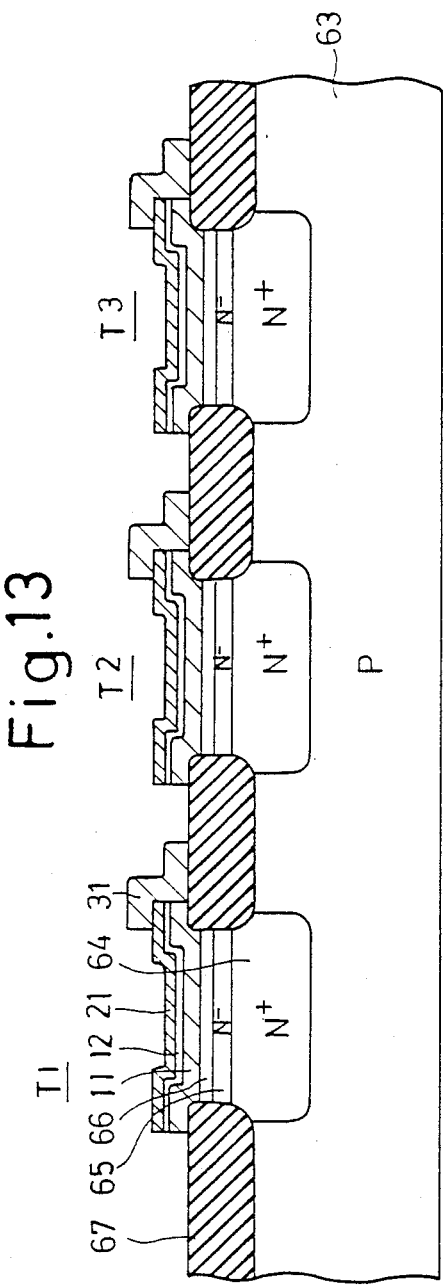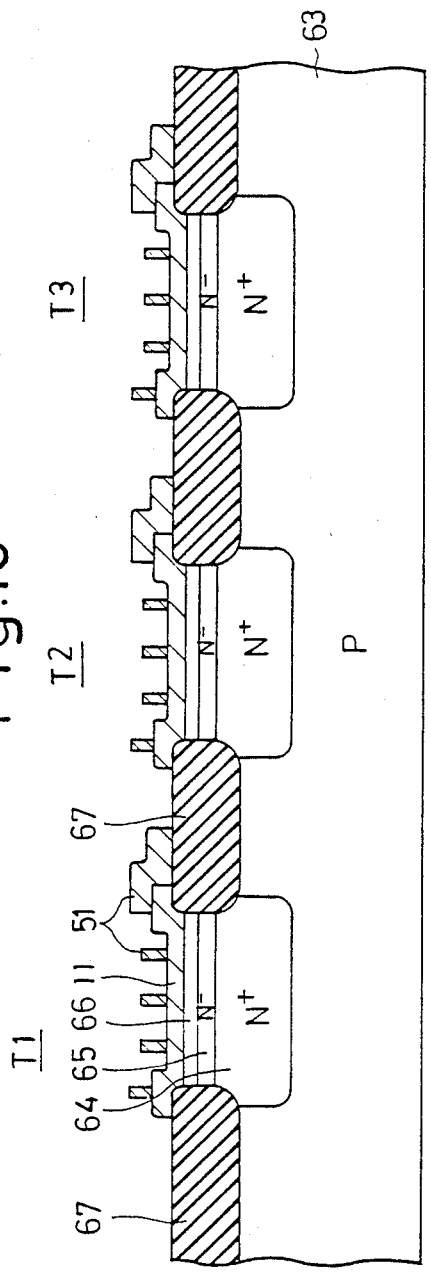

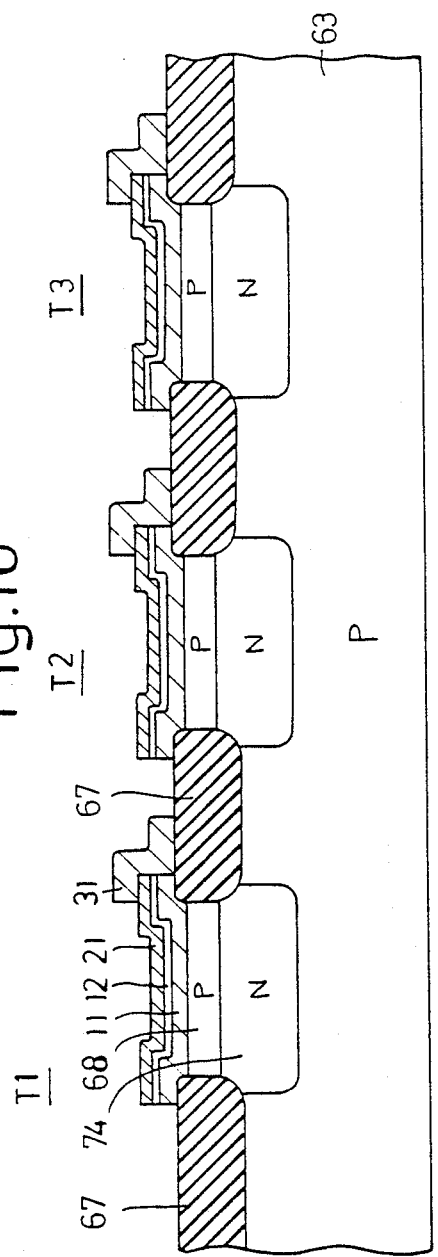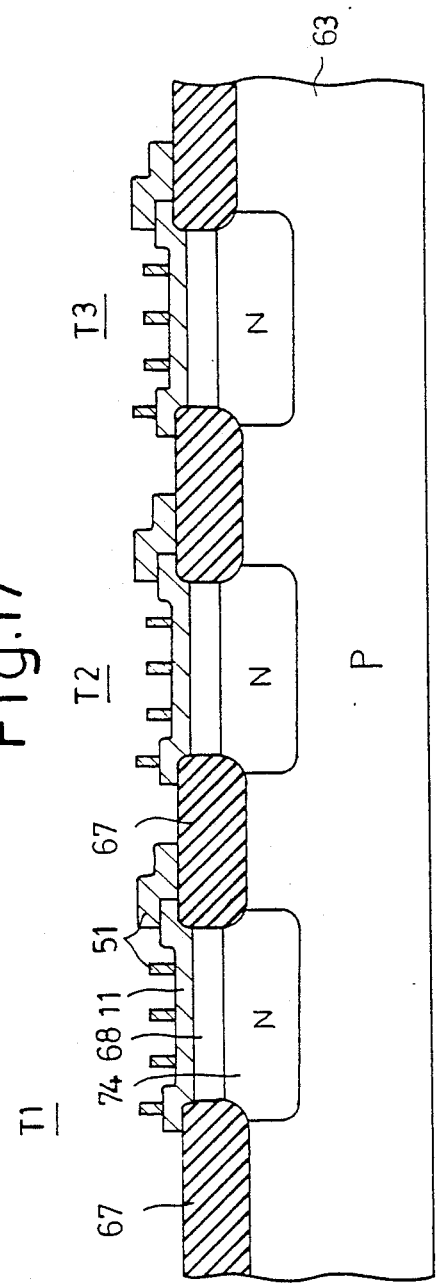

SEMICONDUCTOR PHOTOELECTRIC CONVERSION DEVICE

BACKGROUND OF THE INVENTION

1. Field of the Invention

The present invention relates to a semiconductor photoelectric conversion device which has a phototransistor structure.

2. Description of the Prior Art

Heretofore there has been proposed, as a semiconductor photoelectric conversion device of the phototransistor structure, a semiconductor photoelectric conversion device of a vertical NPN (or PNP) type phototransistor structure such that a single-crystal semiconductor substrate of a first conductivity type and serving as a collector region has formed therein on the side of the major surface thereof a single-crystal semiconductor region of a second conductivity type reverse from the first one and serving as a base region and the single crystal semiconductor region has formed therein a single-crystal semiconductor region of the first conductivity type and serving as an emitter region.

With such a conventional photoelectric conversion device, when it is irradiated by light, photo carriers are created at the boundary between the single-crystal semiconductor region acting as the base region and the single-crystal semiconductor region acting as the emitter region or in the vicinity of the abovesaid boundary, and the photo carriers are injected into the single-crystal semiconductor region acting as the base region, thereby obtaining multiplied photocurrent to perform photoelectric conversion.

In this case, a bias source is connected between the single-crystal semiconductor substrate as the collector region and the single-crystal semiconductor region as the emitter region but since the single-crystal semiconductor substrate as the collector region and the single-crystal semiconductor region as the base region are both formed of a single-crystal semiconductor, this prior art photoelectric conversion device has the advantages of high withstand voltage against the bias source and little internal leakage of photocurrent.

In the conventional photoelectric conversion device, however, the photo carrier generating efficiency is low partly because the photo carriers are generated at the boundary between the single-crystal semiconductor region as the base region and the single-crystal semiconductor region as the emitter region or in the vicinity of the abovesaid boundary, and partly because the region for generating the photo carriers is very small in thickness and is formed of a single-crystal semiconductor of small light absorption coefficient.

Accordingly, the abovesaid photoelectric conversion device is low in photoelectric conversion efficiency Further since the photo carriers are created at the boundary between the single-crystal semiconductor region as the base region and the single-crystal semiconductor region as the emitter region or in the neighborhood of the boundary, since the single-crystal semiconductor region as the base region is formed in the single-crystal semiconductor substrate, and since the single-crystal semiconductor region as the emitter region is formed in the single-crystal semiconductor region as the base region, the conventional photoelectric conversion device performs photoelectric conversion only for light of a wavelength specified by the kind of semiconductor used for the single-crystal semiconductor substrate.

Therefore, the prior art photoelectric conversion device possesses the drawback that it has no photoelectric converting function for desired light, for example, visible light.

Further, according to the conventional photoelectric conversion device, the single-crystal semiconductor region as the emitter region is formed in the single-crystal semiconductor region as the base region, and the single-crystal semiconductor region as the base region is formed in the single-crystal semiconductor substrate, so that the single-crystal semiconductor region as the base region is formed of a single-crystal semiconductor of the kind determined by a single-crystal semiconductor of the kind or energy band determined by the kind of the single-crystal semiconductor forming the single-crystal semiconductor substrate. Consequently, the semiconductor region as the emitter region cannot be so formed as not to impose an appreciable loss on the light for generating the photo carriers is the aforesaid photo carrier generating region.

Therefore, the conventional photoelectric conversion device has the defect of low photoelectric conversion efficiency.

Moroever, there has also been proposed such a photoelectric conversion device that is entirely formed of a non-single-crystal semiconductor, including semiconductor regions as the collector region and as the base region.

With such a photoelectric conversion device, however, since the semiconductor regions as the collector region and as the base region are both formed on the non-single-crystal semiconductor, the withstand voltage against the bias source during operation of the device is far lower than the withstand voltage in the case of the aforesaid conventional photoelectric conversion device in which the semiconductor regions as the collector region and as the base region are formed of the single-crystal semiconductor, and leakage of photocurrent is large.

For the abovesaid reasons, the photoelectric conversion device employing the non-single-crystal semiconductor is difficult to put to practical use.

SUMMARY OF THE INVENTION

It is therefore an object of the present invention to provide a photoelectric conversion device which is able to achieve higher photoelectric conversion efficiency than the aforementioned prior art photoelectric conversion devices.

Another object of the present invention is to provide a photoelectric conversion device with which it is possible to obtain high photoelectric conversion efficiency for light of a desired wavelength.

In accordance with an aspect of the present invention, a semiconductor region as a photo carrier generating region is formed between a semiconductor region as base region and a semiconductor region as the emitter region, and the photo carrier generating region is formed of a non-single-crystal semiconductor the light absorption coefficient of which is far larger than that of the single-crystal semiconductor. Accordingly, photo carriers can be generated in the photo carrier generating region with high efficiency.

Therefore, the photoelectric conversion device of the present invention achieves high photoelectric conversion efficiency as compared with the aforementioned photoelectric conversion devices.

In accordance with another aspect of the present invention, the photo carrier generating region of the non-single-crystal semiconductor is provided between the semiconductor regions as the base region and as the emitter region as mentioned above and the non-single-crystal semiconductor region is formed as a non-single-crystal semiconductor layer on the semiconductor region as the base region. With this structure, the photo carrier generating region can be formed of a non-single-crystal semiconductor of a desired kind or energy gap regardless of the kinds of semiconductors used for the semiconductor regions as the collector region, as the base region and as the emitter region.

Accordingly, the photoelectric conversion device of the present invention achieves the photoelectric converting function for light of any desired wavelength, for example, visible light.

In accordance with another aspect of the present invention, the semiconductor region as the emitter region is formed as a non-single-crystal semiconductor layer on the abovesaid photo carrier generating region. With this structure, the semiconductor region as the emitter region can be formed of a non-single-crystal semiconductor of a desired kind or energy gap regardless of the kinds of semiconductors used for the semiconductor regions as the collector region, as the base region and as the photo carrier generating region. Therefore, the semiconductor region as the emitter region can be formed in a manner to minimize the loss of light for creating photo carriers in the photo carrier generating region.

Accordingly, the photoelectric conversion device of the present invention provides higher photoelectric conversion efficiency than do the aforementioned prior art photoelectric conversion devices.

In accordance with another aspect of the present invention, the semiconductor region as the photo carrier generating region and the semiconductor region as the emitter region are both formed of the non-single-crystal semiconductor but since the semiconductor region as the collector region and the semiconductor region as the base region are formed of the single-crystal semiconductor, a high withstand voltage is obtained which is substantially equal to that obtainable with the photoelectric conversion device formed of the single-crystal semiconductor alone, and the internal leakage of photocurrent is small.

Accordingly, the photoelectric conversion device of the present invention is convenient to use and small in the loss of photocurrent.

Other objects, features and advantages of the present invention will become more fully apparent from the following detailed description taken in conjunction with the accompanying drawings.

BRIEF DESCRIPTION OF THE DRAWINGS

FIG. 13 is a cross-sectional view schematically illustrating an eleventh embodiment of the photoelectric conversion device of the present invention;

FIGS. 15 through 17 are cross-sectional views schematically illustrating twelfth to fourteenth emboiments of the photoelectric conversion device of the present invention;

DESCRIPTION OF THE PREFERRED EMBODIMENTS

Figure 1:
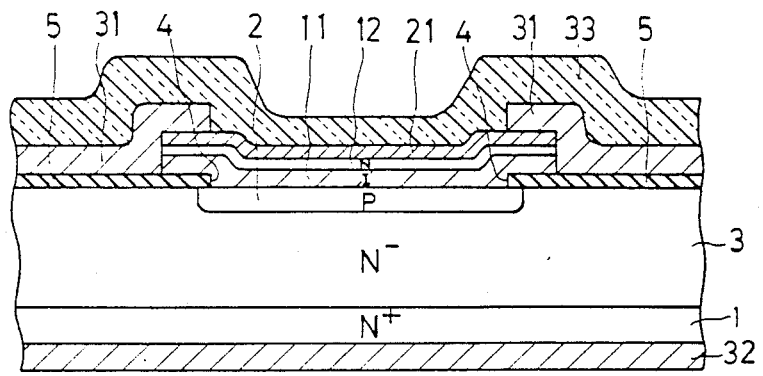
FIG. 1 is a cross-sectional view schematically illustrating a first embodiment of the photoelectric conversion device of the present invention.

FIG. 1 illustrates a first embodiment of the photoelectric conversion device of the present invention, which has such a structure as described below.

The photoelectric conversion device of this embodiment has an $N^-$ type single-crystal semiconductor substrate 3 which has a relatively low impurity concentration. The single-crystal semiconductor substrate 3 is formed of silicon, for instance.

In the single-crystal semiconductor substrate 3 an $N^+$ type single-crystal semiconductor region 1 of relatively high impurity concentration is formed on the side of the lower major surface of the substrate 3.

On the upper major surface of the single-crystal semiconductor substrate 3 is formed an insulating film 5 which is formed as of a silicon oxide and has a window 4. Further, P type single-crystal semiconductor region 2 is formed in the single-crystal semiconductor substrate 3 on the side of the upper major surface thereof right under the window 4.

An I type non-single-crystal semiconductor layer 11 (which may contain a very small amount of P or N type impurity, for example, boron, in such a sufficiently low impurity concentration as $10^{15}$ to $10^{17}$ atoms cm$^{-3}$), which is doped with a recombination center neutralizer, hydrogen, or a halogen, such as fluorine or chlorine, is formed on the single-crystal semiconductor region 2 to cover the entire area of the exposed surface thereof. In this case, the outer marginal portion of the non-single-crystal semiconductor layer 11 slightly covers the insulating film 5. The non-single-crystal semiconductor layer 11 may preferably be formed of an amorphous or semi-amorphous semiconductor, in particular, an amorphous or semi-amorphous semiconductor, such as Si, Ge, $Si_xGe_{1-x}$, $Si_xC_{1-x}$, $Si_xSn_{1-x}$ or $Si_xPb_{1-x}$ (such as disclosed in my prior U.S. Pat. No. 4,409,134 issued Oct. 11, 1983). Such an amorphous or semi-amorphous semiconductor can be formed by known plasma CVD method.

An N type non-single-crystal semiconductor layer 12 is formed all over the non-single-crystal semiconductor layer 11. The non-single-crystal semiconductor layer 12 way preferably be formed of a non-single-crystal semiconductor which has a larger energy band than does the non-single-crystal semiconductor layer 11. It is preferable that the non-single-crystal semiconductor layer 12 be formed of a microcrystalline semiconductor, in particular, a microcrystalline semiconductor of Si, Ge, $Si_xGe_{1-x}$, $Si_xC_{1-x}$, $Si_xSn_{1-x}$ or $Si_xSb_{1-x}$, or a fibrous-structure semiconductor (such as set forth in my prior U.S. patent application Ser. No. 497,702) U.S. Pat. No. 4,591,893, issued May 27, 1986, of abovesaid material.

A light transparent conductive layer 21 is formed all over the non-single-crystal semiconductor layer 12. In view of high conductivity and high light transmittivity required of the light transparent conductive layer 21 and for preventing that during formation of the light transparent conductive layer 21, it reacts with the material of the non-single-crystal semiconductor layer 12 or an impurity contained thereon to form at the boundary between the layers 21 and 12 a layer which increases the contact resistance therebetween or a layer of low light transmittivity, it is preferred that the light transparent conductive layer 21 be formed of an indium oxide, or a metallic oxide consisting principally of indium oxide, for example, an indium oxide containing 1 to 10 wt% of tin oxide, since the non-single-crystal semiconductor layer 12 is N-type. Incidentally, in the case were the non-single-crystal semiconductor layer 21 is P-type, it is preferable, for the same reasons as given above, that the light transparent conductive layer 21 be formed of an oxide, or a metallic oxide consisting principally of tin oxide, for example, a tin oxide which contains 1 to 10 wt% of antimony oxide or halogen.

The marginal portion of the light transparent conductive layer 21 is covered with a conductive layer 31. The conductive layer 31 is formed, for example, of aluminum and extends on the marginal edges of the light transparent conductive layer 21 and the non-single-crystal semiconductor layers 11 and 12 and then covers the insulating film 5.

Further, a light transparent, insulating protective film 33 is formed to cover the light transparent conductive layer 21, the conductive layer 31 and the insulating film 5.

Moreover, a conductive layer 32 is formed over the single-crystal semiconductor region 1 on the underside of the single-crystal semiconductor substrate 3.

The above is a description of the structure of the first embodiment of the photoelectric conversion device of the present invention.

Such a photoelectric conversion device can be manufactured in such a manner as described below.

Figure 3A:
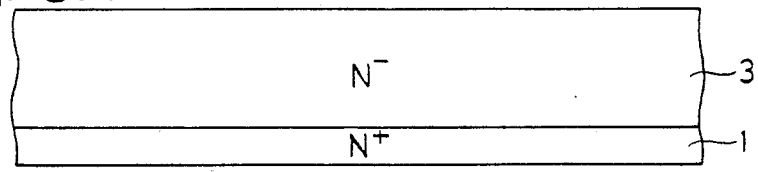
FIGS. 3A through 3F are schematic cross-sectional views showing a sequence of steps involved in the manufacture of the photoelectric conversion device of FIG. 1.

As shown in FIG. 3A, the manufacture begins with the preparation of the single-crystal semiconductor substrate 3 having the single-crystal semiconductor region 1 formed on the underside thereof as described previously in respect of FIG. 1.

Figure 3B:
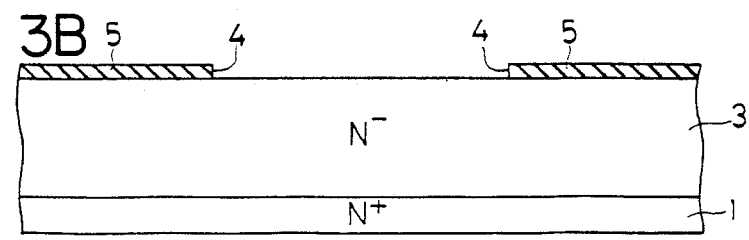

Then the insulating film 5 having the window 4, described previously with regard to FIG. 1, is formed on the single-crystal semiconductor substrate 3 as shown in FIG. 3B.

Figure 3C:
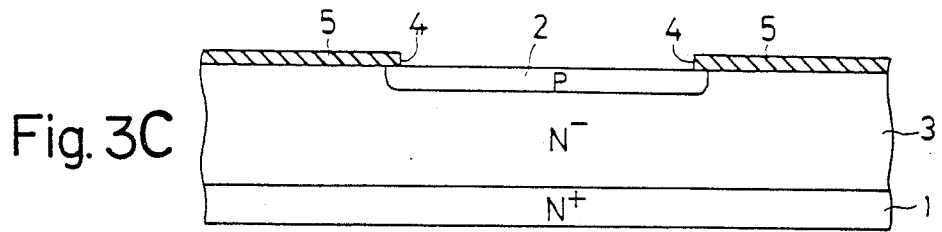

Next, the P type single-crystal semiconductor region 2 is formed in the region of the single-crystal semiconductor substrate 3 underlying the window 4 by a known P type impurity introducing method through using the insulating film 5 as a mark for the single-crystal semiconductor substrate 3 as depicted in FIG. 3C.

Figure 3D:
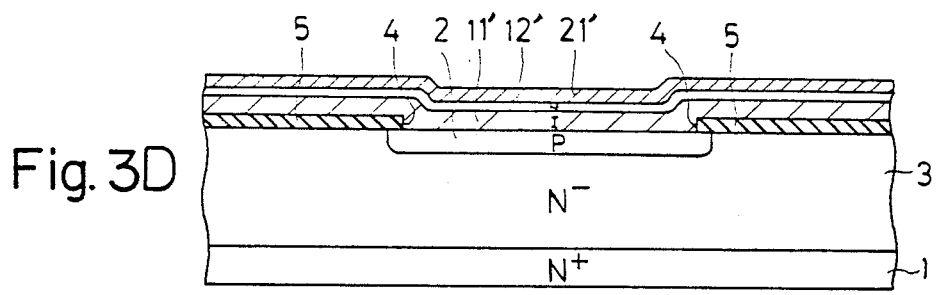

Next, as shown in FIG. 3D, and I type non-single crystal semiconductor layer 11' is formed by a known method, for example, plasma CVD, on the single-crystal semiconductor substrate 3 to cover the single-crystal semiconductor region 2 and the insulating film 5. This is followed by the formation of an N type non-single-crystal semiconductor layer 12' on the non-single-crystal semiconductor layer 11' through a known method, for example, the plasma CVD method. Then a light transparent conductive layer 21' is formed as by evaporation on the non-single-crystal semiconductor layer 12'.

Figure 3E:
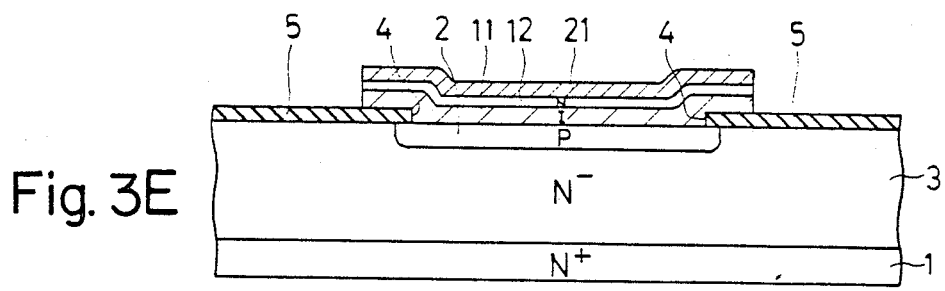

Next, the light transparent conductive layer 21' and the non-single-crystal semiconductor layers 12' and 11' are selectively removed by known etching treatment through a mask (not shown) to form the non-single-crystal semiconductors layers 11 and 12 and the light transparent conductive layers 21 described previously in respect of FIG. 1, as shown in FIG. 3E.

Figure 3F:
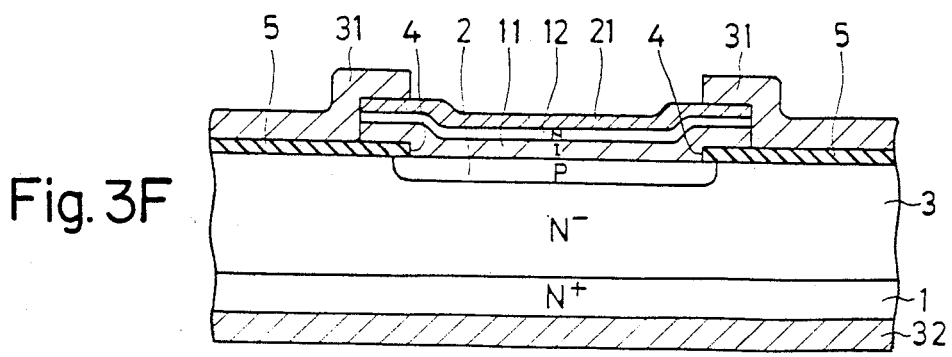

Next, as shown in FIG. 3F, the conductive layer 31, which covers the light transparent conductive layer 21 and extends on to the insulating layer 5, and the conductive layer 32, which extends on the single-crystal semiconductor region 1 formed on the underside of the single-crystal semiconductor substrate 3, are formed by a known method.

Next, the light transparent, insulating protective film 33 covering the light transparent conductive layer 21 and the conductive layer 31 is formed, for instance, by deposition on the single-crystal semiconductor substrate 3.

In this manner, the photoelectric conversion device of FIG. 1 is manufactured.

Figure 2:
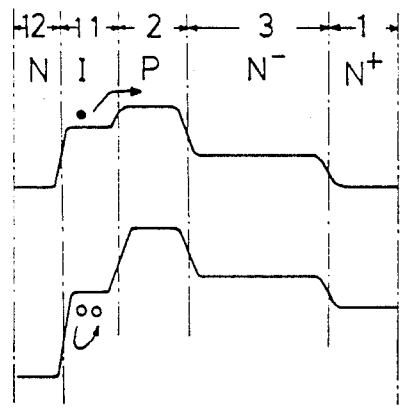
FIG. 2 is a diagram showing its energy band structure.

In the photoelectric conversion device of the present invention depicted in FIG. 1, the structure which is made up of the single-crystal semiconductor substrate 3, the single-crystal semiconductor region 1 formed on the underside thereof, the single-crystal semiconductor region 2 and the non-single-crystal semiconductor layers 11 and 12 has such a band structure as illustrated in FIG. 2.

Accordingly, the photoelectric conversion device of FIG. 1 is equipped with a vertical N N-PIN type photo transistor structure in which the single-crystal semiconductor substrate 3 and the single-crystal semiconductor region 1 formed on the underside thereof constitute the collector region, the single-crystal semiconductor region 2 the base region, the non-single-crystal semiconductor layer 11 the photo carrier generating region, the non-single-crystal semiconductor layer 12 the emitter region, the light transparent conductive layer 21 the emitter electrode, the conductive layer 31 the emitter lead and the conductive layer 32 the collector electrode or lead.

With such an arrangement, when the light transparent, insulating protective film 33 is irradiated by light from above, the light passes through the film 33 and the non-single-crystal semiconductor layer 12 and is incident on the non-single-crystal semiconductor layer 11 that is the photo carrier generating region. In consequence, photo carriers (electrons and holes) are created in the non-single-crystal semiconductor layer 11 and the electrons are injected into the single-crystal semiconductor region 2 that is the base region. Accordingly, if a bias source is connected via a load across the conductive layers 31 and 32 to make the latter positive relative to the former, amplified current flows to the load across the conductive layers 31 and 32.

In this case, since the non-single-crystal semiconductor layer 11 as the photo carrier generating region is formed of a non-single-crystal semiconductor and since the non-single-crystal semiconductor generally has a light absorption coefficient about 10 times larger than those of single-crystal semiconductors, photo carriers are generated efficiently in the non-single-crystal semiconductor layer 11. This is more marked in the case where the non-single-crystal semiconductor layer 11 is formed of an amorphous or semiamorphous semiconductor.

Further, if the non-single-crystal semiconductor layer 12 has a large energy gap than does the non-single-crystal semiconductor layer 11, the layer 12 acts as a window of high light transmittivity for the light that creates the photo carriers in the non-single-crystal semiconductor layer 11, permitting efficient incidence of the light on the non-single-crystal semiconductor layer 11. Accordingly, photo carriers can be generated in large quantities in the non-single-crystal semiconductor layer 11.

Moreover, when the non-single-crystal semiconductor layer 12 is formed of the microcrystalline semiconductor, its light absorption coefficient is smaller than that of the amorphous or semi-amorphous semiconductor, so that light can be applied to the non-single-crystal semiconductor layer 11 without being unnecessarily absorbed by the non-single-crystal semiconductor layer 12. This ensures to generate photo carriers in large quantities in the non-single-crystal semiconductor layer 11. This is more marked when the non-single crystal semiconductor layer 12 has the fibrous structure.

Besides, since the non-single-crystal semiconductor material forming the non-single-crystal semiconductor layer 11 can freely be selected from the group consisting of Si, Ge, $Si_xGe_{1-x}$, $Si_xC_{1-x}$, $Si_xSn_{1-x}$, $Si_xPb_{1-x}$ and so forth, photo carriers can be created in the non-single-crystal semiconductor layer 11 in response to light of a desired wavelength, in particular, visible light. That is to say, the optical energy band gap of single-crystal silicon is 1.1 eV, whereas the optical energy band gap of amorphous silicon is 1.6 to 1.8 eV. Therefore, even if the non-single-crystal semiconductor layer 11 is formed of silicon, photo carriers can be created by visible light. Further, since the energy band gaps of amorphous germanium and amorphous $Si_xC_{1-x}$ are 1 to 1.2 eV and 1.1 to 1.8 eV, respectively, even if the non-single-crystal semiconductor layer 11 is formed of germanium or $Si_xC_{1-x}$, photo carriers can be generated by visible light.

Moreover, since the non-single-crystal semiconductor material of the non-single-crystal semiconductor layer 12 can be freely selected from the group consisting of Si, Ge, $Si_xGe_{k-x}$, $Si_xC_{1-x}$, $Si_xSn_{1-x}$, $Si_xPb_{1-x}$ and so forth, the non-single-crystal semiconductor layer 12 imposes no appreciable loss on the light for generating the non-single-crystal semiconductor layer 11.

In addition, the non-single-crystal semiconductor layers 11 and 12 are formed of the non-single-crystal semiconductor, but since the single-crystal semiconductor substrate 3 and the single-crystal semiconductor regions 1 and 2 are formed of the single-crystal semiconductor, the withstand voltage is high and the leakage of photocurrent is small.

Thus, the photoelectric conversion device of the present invention provides high photoelectric conversion efficiency for light of desired wavelength and is practical and easy to manufacture.

Next, a description will be given of modified forms of the photoelectric conversion device of the present invention.

The photoelectric conversion device of FIG. 1 has the N+N− PIN type photo-transistor structure.

Figure 4:
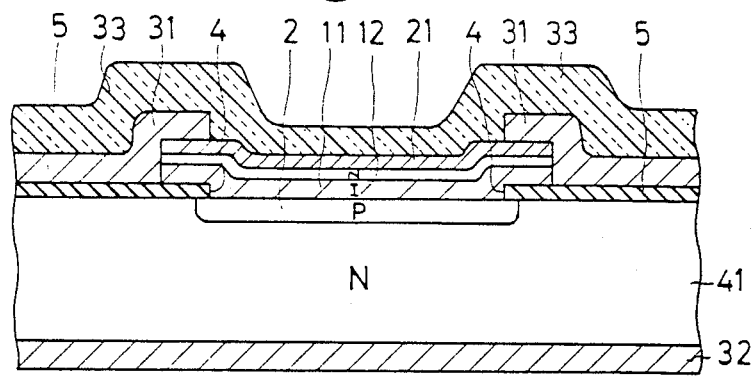
FIGS. 4 through 12 are cross-sectional views schematically illustrating second to tenth embodiments of the photoelectric conversion device of the present invention.

It is also possible, however, to adopt such a structure of a second embodiment as shown in FIG. 4 in which the single-crystal semiconductor region 1 on the underside of the single-crystal semiconductor substrate 3 is omitted, the N− type single-crystal semiconductor substrate 3 is replaced with an N type single-ctystal semiconductor substrate 41, the insulating film 5 with the window 4 is formed on the upper major surface of the single-crystal semiconductor substrate 41, the single-crystal semiconductor region 2 is formed in the single-crystal semiconductor substrate 41 and the conductive layer 32 is formed on the lower major surface of the single-crystal semiconductor substrate 41.

The second embodiment of such an arrangement has the NPIN type photo-transistor structure in which the single-crystal semiconductor substrate 41 is used as the collector region.

It is evident that the photoelectric conversion device of FIG. 4 also has the same excellent features as does the first embodiment of FIG. 1.

The photoelectric conversion device of FIG. 1 has such a structure that the non-single-crystal semiconductor layers 11 and 12 and the light transparent conductive layer 21 are superimposed.

Figure 5:
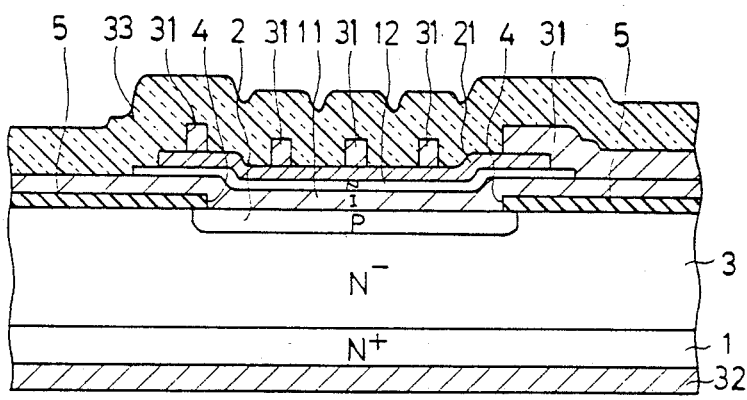

It is also possible, however, to employ such a structure of a third embodiment as shown in FIG. 5 in which the non-single-crystal semiconductor layer 11 is further extended from the marginal portion of the non-single-crystal semiconductor layer 12 onto the insulating film 5 and the conductive layer 31 is extended onto the extended portion of the non-single-crystal semiconductor layer 11 correspondingly. In this case, the conductive layer 31 may also be formed comb-shaped to extend onto the light transparent conductive layer 21 as illustrated.

It is evident that the photoelectric conversion device of FIG. 5 also exhibits the same advantages as those described previously in respect of FIG. 1.

The photoelectric conversion device of the present invention, shown in FIG. 1, has such a structure that provides the function of a photo transistor alone.

Figure 6:
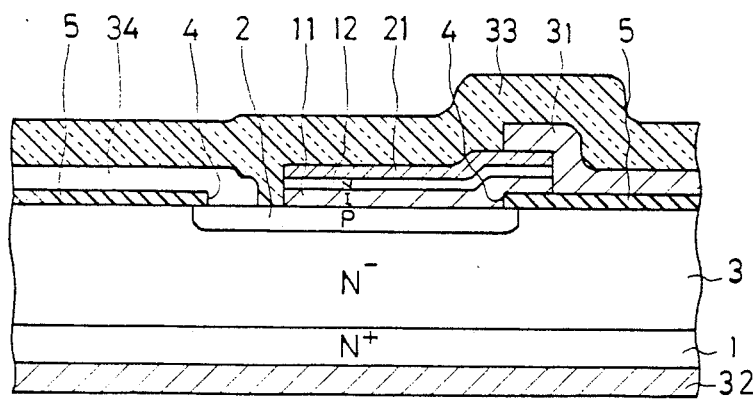

It is also possible, however, to employ such a structure of a fourth embodiment as shown in FIG. 6 in which the laminate member made up of the non-single-crystal semiconductor layers 11 and 12 and the light transparent conductive layer 21 is partly removed at one side on the single-crystal semiconductor region 2 and the conductive layer 34 extending from the surface of the insulating film 5 makes ohmic contact with that region of the single-crystal semiconductor region 2 on which the laminate member comprised of the non-single-crystal semiconductor layers 11 and 12 and the light transparent conductive layer 21 does not extend.

According to the photoelectric conversion device of FIG. 6, base current can be injected through the conductive layer 34 into the single-crystal semiconductor region 2 which acts as the base region. Accordingly, it is apparent that the function of an ordinary bipolar NPN type transistor can be obtained, along with the function of the photo transistor described previously in connection with FIG. 1.

Further, the first embodiment of FIG. 1 has the N+N-PIN type transistor structure.

Figure 7:
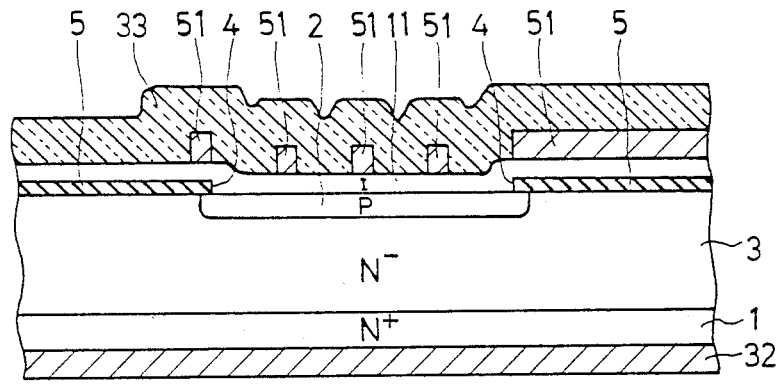

It is also possible, however, to adopt such a structure of a fifth embodiment as shown in FIG. 7 in which the non-single-crystal semiconductor layer 12, the light transparent conductive layer 21 and the conductive layer 31 are replaced with a comb-shaped conductive layer 51 so formed as to make Schottky contact with the non-single-crystal semiconductor layer 11 and the conductive layer 51 is extended onto the insulating film 5.

Since the conductive layer 51 acts as a Schottky junction electrode and its lead, the photoelectric conversion device of FIG. 7 has the Schottky junction type phototransistor structure. Accordingly, it is evident that a function similar to that of the $N^+N^-PIN$ type photo transistor described previously with respect to FIG. 1 can be obtained, through not described in detail.

Moreover, in the embodiment of FIG. 7 which is a modification of the first embodiment of FIG. 1, the collector region is formed by the $N^-$ type single crystal semiconductor region 1 formed on the underside thereof as in the first embodiment of FIG. 1.

Figure 8:
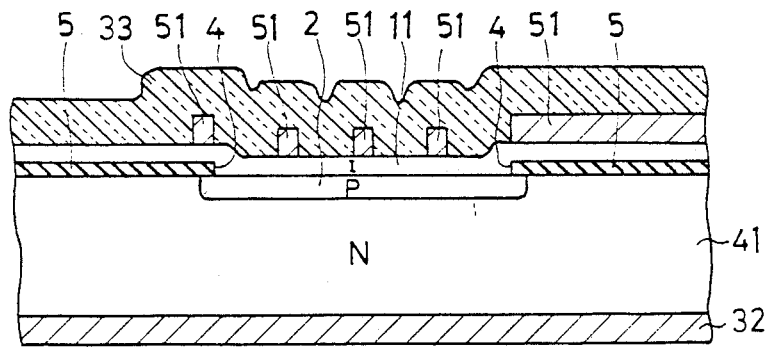

It is also possible, however, to adopt such a structure of a sixth embodiment as shown in FIG. 8 in which the collector region is formed by the N type single-crystal semiconductor substrate 41 alone as in the case of the second embodiment of FIG. 4, by which can be obtained the same operational effect as that obtainable with the embodiment of FIG. 7.

The fifth and sixth embodiments of FIG. 7 and 8, which are modified forms of the photoelectric conversion device of FIG. 1 has the Schottky junction type photo-transistor structure.

Figure 9:
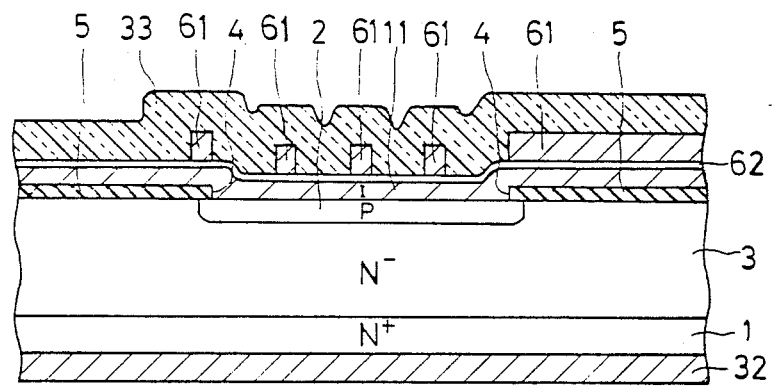
Figure 10:
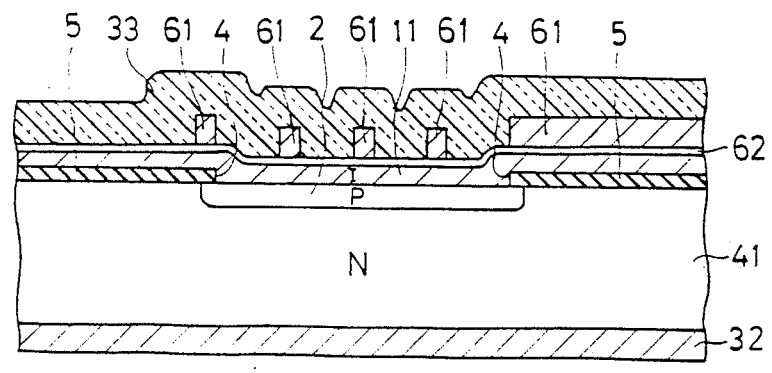

It is also possible, however, to adopt such structures of seventh and eighth embodiments as shown in FIGS. 9 and 10 in which the conductive layer 51 acting as the Schottky junction electrode is omitted and a barrier film 62 as of silicon nitride or silicon carbide and having a thickness of 2 to 20 Å large enough to blow tunnel current is formed on the non-single-crystal layer 11 and, further, a conductive layer 61 of the same pattern as that of the conductive layer 51 is formed on the barrier film 62.

The photoelectric conversion devices of FIGS. 9 and 10 has the barrier film 62 between the non-single-crystal semiconductor layer 11 and the conductive layer 62, and hence possesses the tunnel type photo-transistor structure. Accordingly, it is evident that the same function as that of the Schottky junction type photo transistor described above in respect of FIGS. 7 and 8 can be obtained, though not described in detail.

In FIG. 1, one $N^+N^-PIN$ type photo-transistor is illustrated.

Figure 11:
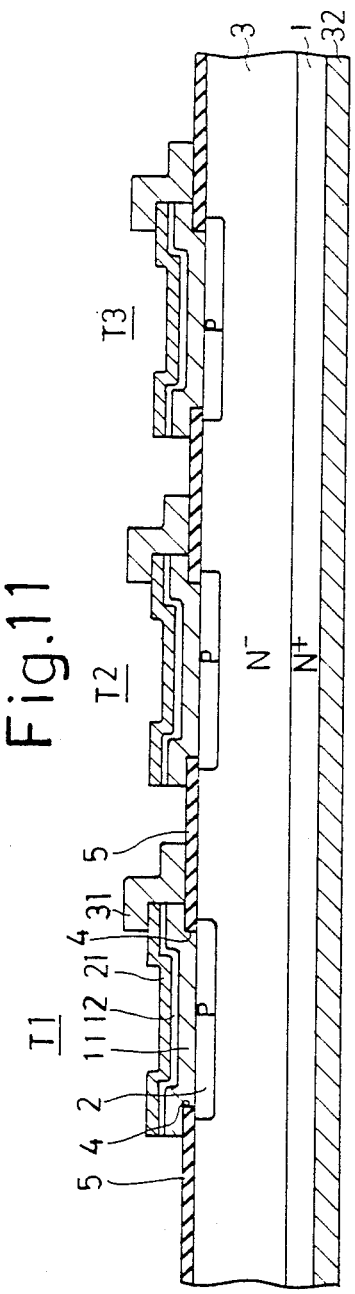
Figure 12:
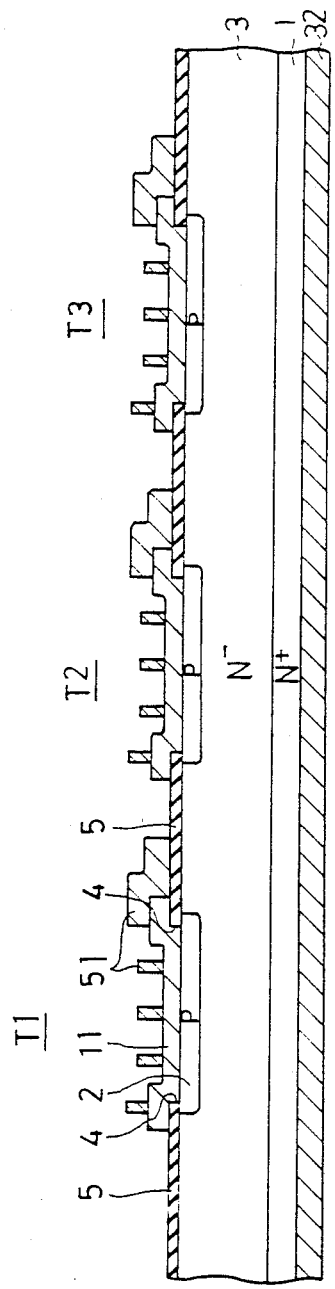

It is also possible, however, to adopt such a structure of ninth and tenth embodiments of the photoelectric conversion device of the present invention, shown in FIGS. 11 and 12 in which a plurality of photo-transistors, for instance three photo-transistors T1, T2 and T3, are formed on the single-crystal semiconductor substrates 3.

According to the ninth and tenth embodiments shown in FIGS. 11 and 12, by the irradiation of light though different color filters (not shown) to the photo-transistor T1, T2 and T3, different color light can be converted to photo current by the photo-transistors T1, T2 and T3, respectively.

Ninth embodiment of the photoelectric conversion device of the present invention, shown in FIGS. 11, have such a structure that a plurality of photo transistors uses the single-crystal semiconductor substrate 3 in common to them as the single-crystal semiconductor regions serving as their collector regions.

It is also possible, however, to adopt such a structure of an eleventh embodiment as shown in FIG. 13 in which the single-crystal semiconductor substrate 3, the single-crystal semiconductor region 1 and the conductive layer 32 are replaced with a P type single-crystal semiconductor substrate 63 and a plurality of $N^+$ single-crystal semiconductor regions 64 are formed as the single-crystal semiconductor region 1 in the case of FIG. 11 on the side of the major surface of the single-crystal semiconductor substrate 63 and, further, an $N^-$ type single-crystal semiconductor layer 65 and a P type non-single-crystal semiconductor layer 66 are formed, in this order, on each single-crystal semiconductor region 64 as the single-crystal semiconductor substrate 3 and the single-crystal semiconductor region 2 in the case of FIG. 11. In this case, the single-crystal semiconductor regions 64 are each isolated from adjacent ones of them by the PN junctions between it and the single-crystal semiconductor substrate 63. Further, pairs of single-crystal semiconductor layers 65 and 66 are each isolated from adjacent ones of them by an insulating film 67 extending from the surface of the single-crystal semiconductor layer 66 into the single-crystal semiconductor substrate 63.

The photoelectric conversion device of FIG. 13 can be manufactured in such a manner as described below.

Figure 14A:
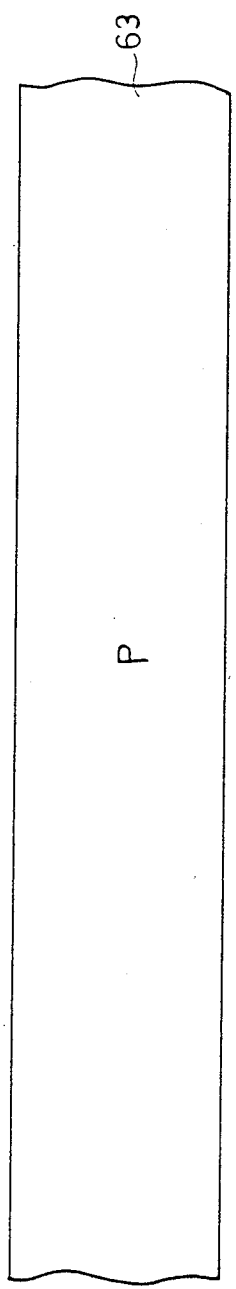
FIGS. 14A through 14F are cross-sectional views schematically showing a sequence of steps involved in the manufacture of the photoelectric conversion of FIG. 13.

As shown in FIG. 14A, the manufacture starts with the preparation of the P type single-crystal semiconductor substrate 63 described above in respect of FIG. 13.

Figure 14B:
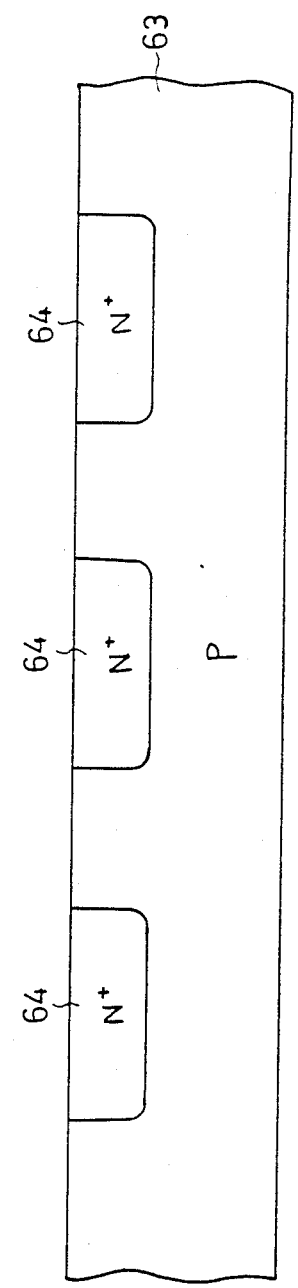

Next, as shown in FIG. 14B, the plurality of $N^+$ type single-crystal semiconductor regions 64 described above with respect to FIG. 13 are formed in the single-crystal semiconductor substrate 63 from the side of its upper major surface.

Figure 14C:
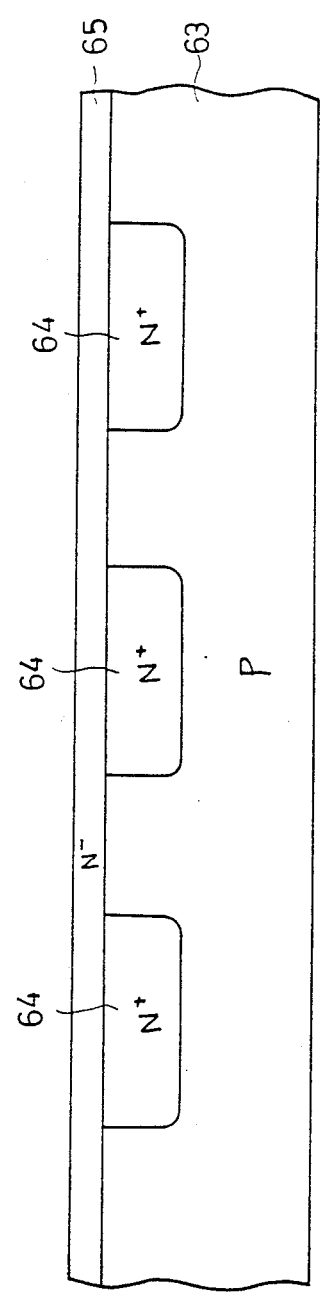

Next, an $N^-$ type single-crystal semiconductor layer 65' is formed to extend onto the single-crystal semiconductor 64 as shown in FIG. 14C.

Figures 14D, 14E, 14F:
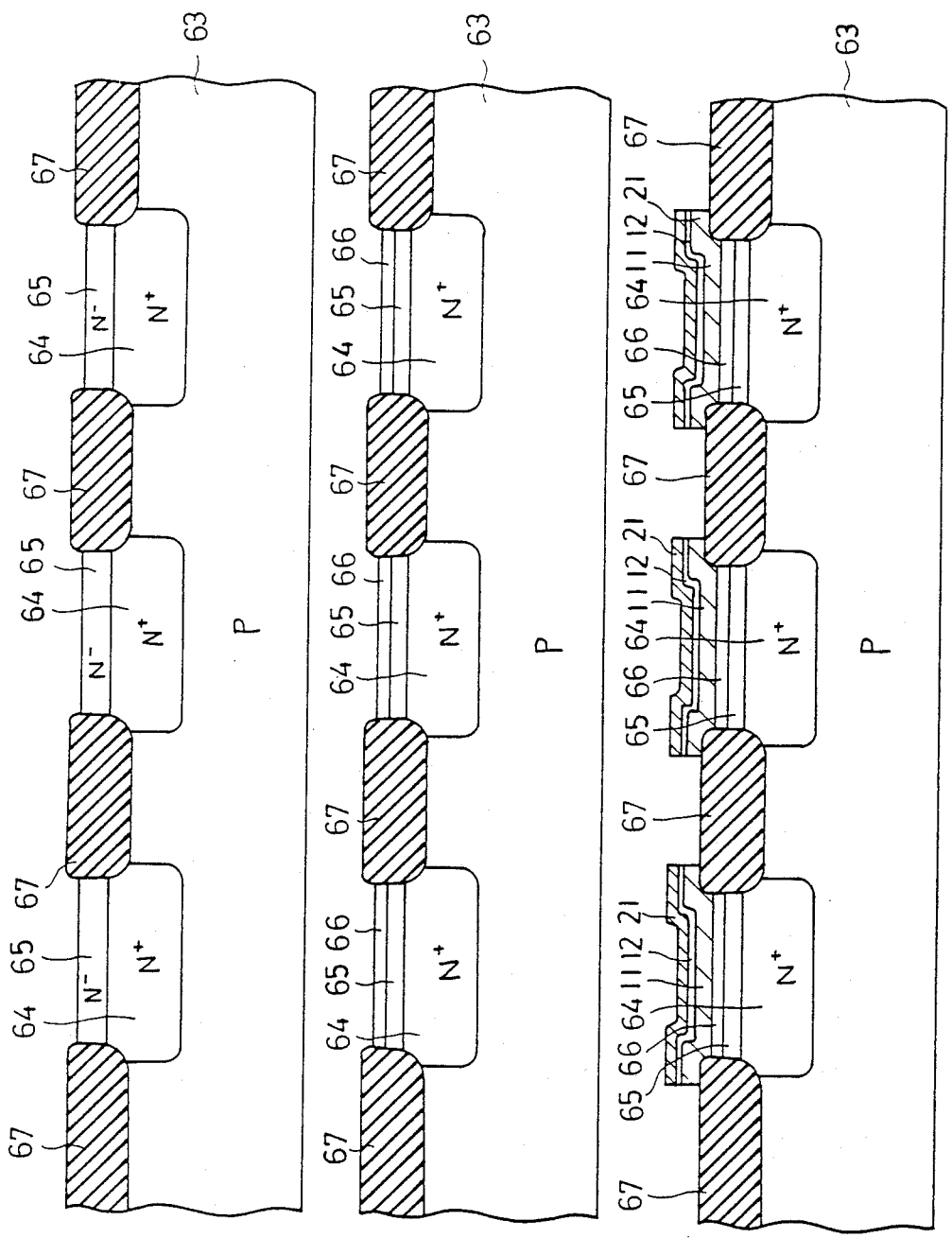

Next, by thermal oxidation of the single-crystal semiconductor layer 65' and the single-crystal semiconductor substrate 63 through a mask (not shown), the insulating film 67 described above in connections with FIG. 13 is formed and, at the same time, the plurality of single-crystal semiconductor layer 65 are formed as shown in FIG. 14D.

Next, a P type impurity is introduced into the single-crystal semiconductor layers 65 to form therein the P type single-crystal semiconductor layers 66 in the upper portions thereof.

Next, the non-single-crystal semiconductor layers 11 and 12 and the light transparent conductive layer 21 are plaminated in this order on each single-crystal semiconductor layer 66 as shown in FIG. 14F.

Next, the conductive layer 31 is provided in each light transparent conductive layer 21 to obtain the photoelectric conversion device shown in FIG. 13.

It will be seen that the photoelectric conversion device of FIG. 13, which can be manufactured by the method shown in FIGS. 14A through 14F, performs the same function as that of the photoelectric conversion device of FIG. 1. In this embodiment, however, the plurality of transistors are electrically each isolated by the PN junction between each single-crystal semiconductor region 64 and the single-crystal semiconductor substrate 63 and the insulating film 67, so that even if the transistor are formed with high density, they do not interfere with one another.

The eleventh embodiment of FIG. 13 has such a structure that a plurality of N+N−IPN type photo transistors are formed.

It is also possible, however, to adopt such a structure of a twelfth embodiment as shown in FIG. 15 in which the non-single-crystal semiconductor layer 12, the light transparent conductive layer 21 and the conductive layer 31 in each transistor in FIG. 13 is replaced with a conductive layer 51 which serves as a Schottky junction electrode, as in the fifth embodiment of FIG. 7.

The eleventh and twelfth embodiments of FIGS. 13 and 15 have such a structure that a plurality of N+N−PIN type photo transistors are formed.

It is also possible, however, to adopt such a structure of thirteenth and fourteenth embodiments as shown in FIG. 16 and 17 in which the single-crystal semiconductor region 64 is replaced with an N type single-crystal semiconductor region 74 and the single-crystal semiconductor layers 65 and 66 of each transistor in FIGS. 13 and 15 are replaced with a P type single-crystal semiconductor layer 68 to provide the transistor with the NPIN type photo-transistor structure.

Figure 18:
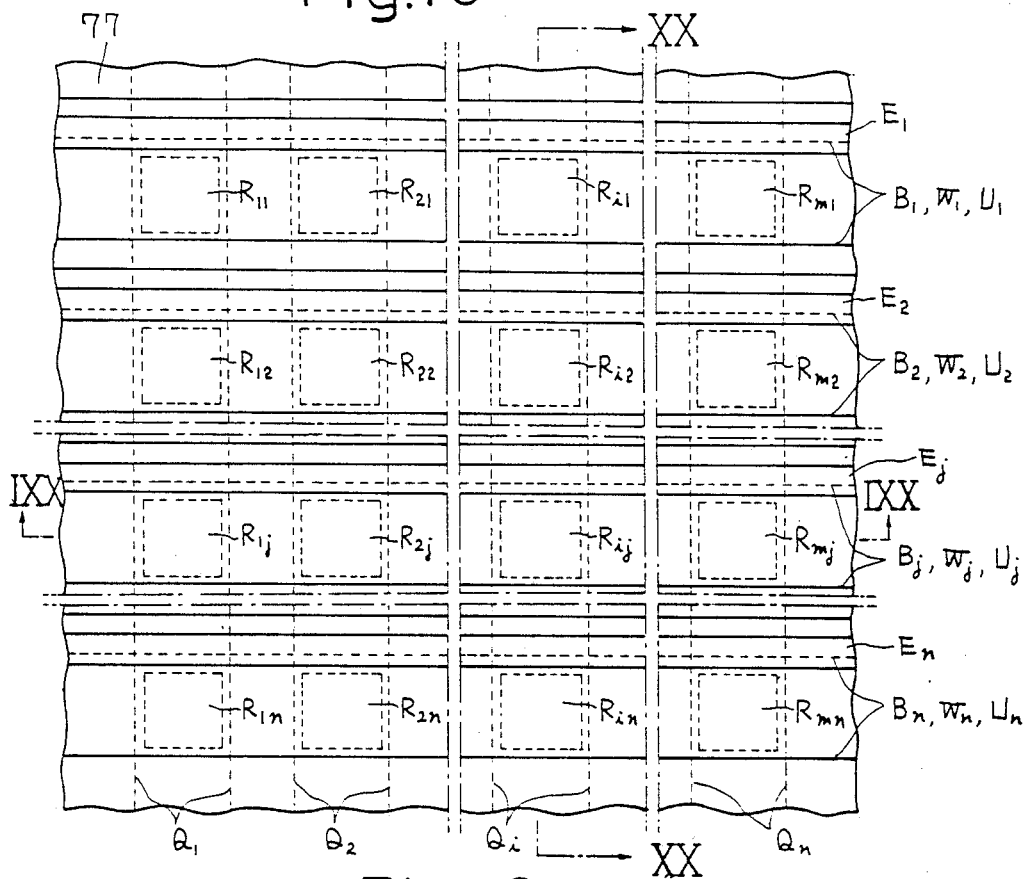
FIGS. 18, 19 and 20 are a plan view showing a fifteenth embodiment of the photoelectric conversion device of the present invention, a cross-sectional view taken on the line IXX—IXX in FIG. 18 and a cross-sectional view taken on the line XX—XX in FIG. 18.
Figure 19:
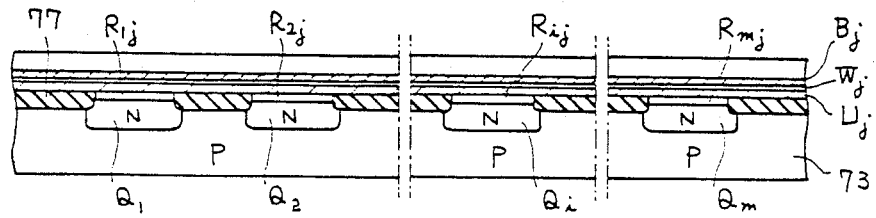
Figure 20:
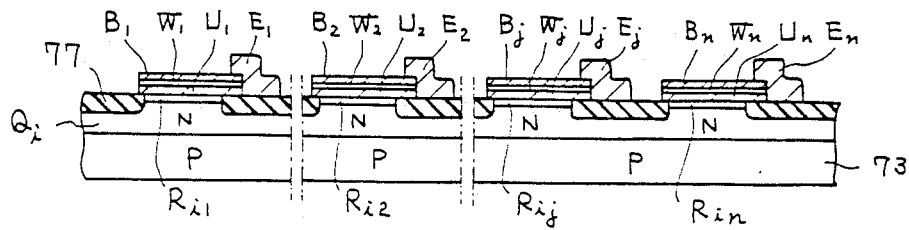

FIGS. 18 to 20 illustrate a fifteenth embodiment which is extended from the thirteenth embodiment of FIG. 16.

The fifteenth embodiment of FIGS. 18 to 20 has such a structure as follows:

A single-crystal semiconductor substrate 73, which is similar to that 63 described above in respect of FIG. 16, has formed therein a plurality m of N type single crystal semiconductor regions $Q_1, Q_2, \ldots Q_m$ which are similar to those 74 described above in connection with FIG. 16 and which extend in the substrate 73 in a second direction on the side of its major surface and are arranged side by side in a first direction intersecting the second one.

On the single-crystal semiconductor region $Q_i$ (i=1, 2, ... m) a plurality n of P type single-crystal semiconductor regions $R_{i1}, R_{i2}, \ldots R_{in}$, which are similar to those 68 in FIG. 16, are formed side by side in the second direction.

On the single-crystal semiconductor substrate 73 a plurality n of non-single-crystal semiconductor layers $U_1, U_2, \ldots U_n$, which are similar to that 11 in FIG. 16, are formed to extend in the first direction in contact with the single-crystal semiconductor regions $R_{11}$ to $R_{m1}$, $R_{12}$ to $R_{m2}$, ... $R_{1n}$ to $R_{mn}$ and arranged side by side in the second direction.

A non-single-crystal semiconductor layer $W_j$, similar to that 12 in FIG. 16, is formed on the non-single-crystal semiconductor layer $U_j$ (j=1, 2, ... m).

On the non-single-crystal semiconductor layer $W_j$ is formed a light transparent conductive layer $B_j$ which is similar to that 21 in FIG. 16.

A conductive layer $E_j$, which is similar to that 31 in FIG. 16, is attached to the light transparent conductive layer $B_j$.

The abovesaid single-crystal semiconductor layers $R_{11}$ to $R_{mm}$ are each isolated from adjacent ones of them by an insulating film 77 which is similar to that 67 in FIG. 16.

Figure 21:
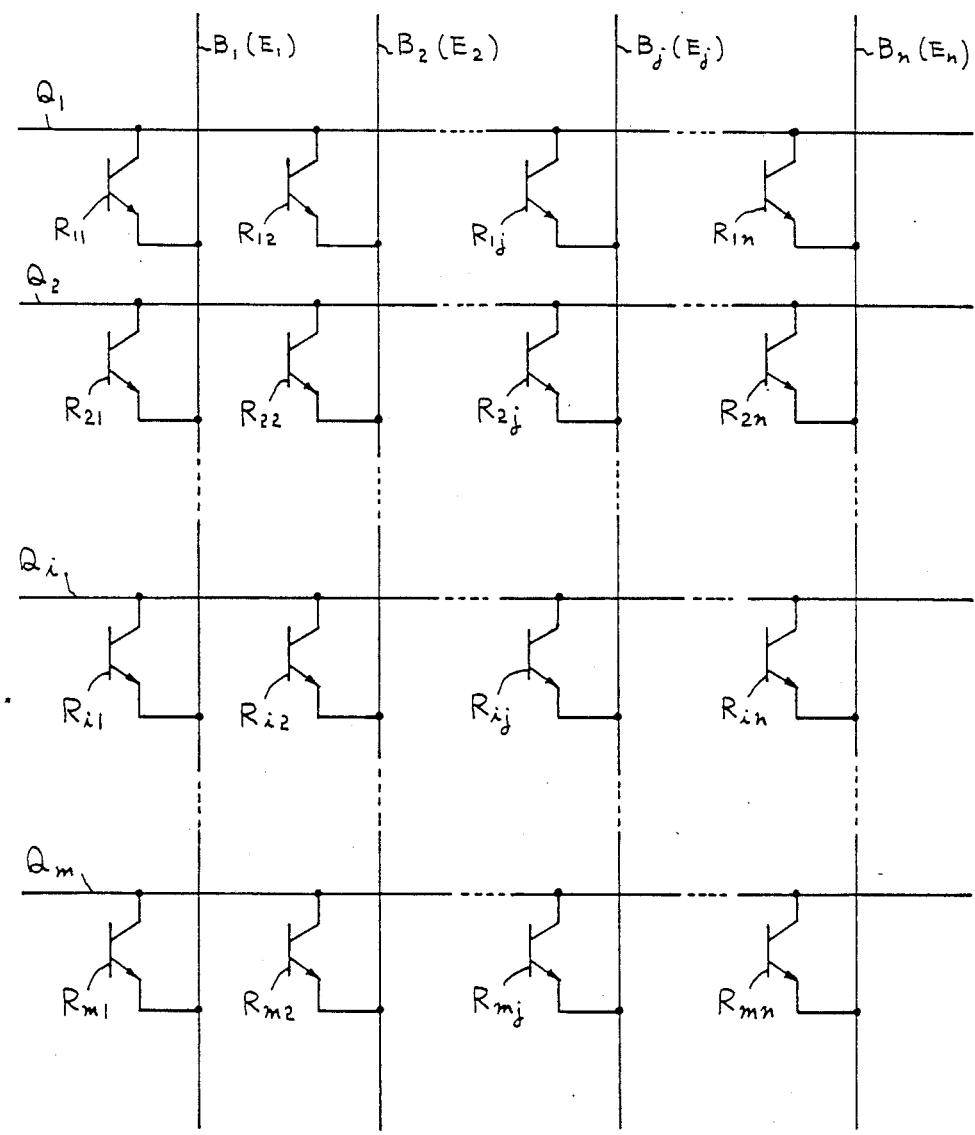
FIG. 21 is an electric circuit diagram of the fifteenth embodiment of the photoelectric conversion device of the present invention.

The fifteenth embodiment of the photoelectric conversion device of the present invention, shown in FIGS. 18 to 20, has such a structure that NPIN type photo transistors $T_{11}$ to $T_{mm}$ are arranged in such a matrix form as shown in FIG. 21. Accordingly, this structure can be used as a two-dimensional image sensor.

The foregoing embodiments are merely illustrative of the present invention and should not be construed as limiting the present invention specifically thereto. It will be seen that the N− type non-single-crystal semiconductor layer 11 can also be replaced with an I type one and that the aforementioned N and P conductivity types can also be reversed.

It will be apparent that many modifications and variations may be effected without departing from the scope of the novel concepts of the present invention.

What is claimed is:

1. A semiconductor photoelectric conversion device comprising;

a substrate serving as a collector region, the substrate being composed of single-crystal semiconductor and having a first conductivity;

a first conductive layer serving as a collector electrode, the first conductive layer being formed on the first major surface of the substrate;

a first semiconductor layer serving as a base region, the first semiconductor layer being formed in the substrate on the side of the second major surface opposite from the first major surface and having a second conductivity type opposite from the first conductivity type;

a second semiconductor layer serving as a photo carrier generating region, the second semiconductor layer being formed on the first semiconductor layer, composed of non-single-crystal semiconductor and doped with a recombination center neutralizer and having an I conductivity type;

a third semiconductor layer serving as an emitter region, the third semiconductor layer being formed on the second semiconductor layer and composed of non-single-crystal semiconductor and having the first conductivity type; and a second conductive layer serving as an emitter electrode, the second conductive layer being formed on the third semiconductor layer.

2. A semiconductor photoelectric conversion device according to claim 1, wherein the first semiconductor layer is composed of single-crystal semiconductor.

3. A semiconductor photoelectric conversion device according to claim 1, wherein the second conductive layer is transparent.

4. A semiconductor photoelectric conversion device comprising;

a substrate serving as a part of a collector region, the substrate being composed of single-crystal semiconductor and having a first conductivity;

a first semiconductor layer serving as the other part of the collector region, the first semiconductor layer being formed on the first major surface of the substrate and having the first conductivity type but higher in impurity concentration than the substrate;

a first conductive layer serving as a collector electrode, the first conductive layer being formed on the underside of the first semiconductor layer;

a second semiconductor layer serving as a base region, the second semiconductor layer being formed in the substrate on the side of the second major surface opposite from the first major surface and having a second conductivity type opposite from the first conductivity type;

a third semiconductor layer serving as a photo carrier generating region, the third semiconductor layer being formed on the second semiconductor layer, composed of non-single-crystal semiconductor and doped with a recombination center neutralizer and having an I conductivity type;

a fourth semiconductor layer serving as an emitter region, the fourth semiconductor layer being formed on the third semiconductor layer and composed of non-single-crystal semiconductor and having the first conductivity type; and a second conductive layer serving as an emitter electrode, the second conductive layer being formed on the fourth semiconductor layer.

5. A semiconductor phtoelectric conversion device according to claim 4, wherein the first and second semiconductor layers are composed of single-crystal semiconductor.

6. A semiconductor photoelectric conversion device according to claim 4, wherein the second conductive layer is transparent.

7. A semiconductor photoelectric conversion device comprising;

a substrate serving as a part of a collector region, the substrate being composed of single-crystal semiconductor and having an I conductivity;

a first semiconductor layer serving as the other part of the collector region, the first semiconductor layer being formed on the first major surface of the substrate and having a first conductivity type;

a first conductive layer serving as a collector electrode, the first conductive layer being formed on the underside of the first semiconductor layer;

a second semiconductor layer serving as a base region, the second semiconductor layer being formed in the substrate on the side of the second major surface opposite from the first major surface and having a second conductivity type opposite from the first conductivity type;

a third semiconductor layer serving as a photo carrier generating region, the third semiconductor layer being formed on the second semiconductor layer, composed of non-single-crystal semiconductor and doped with a recombination center neutralizer and having the I conductivity type;

a fourth semiconductor layer serving as an emitter region, the fourth semiconductor layer being formed on the third semiconductor layer and composed of non-single-crystal semiconductor and having the first conductivity type; and a second conductive layer serving as an emitter electrode, the second conductive layer being formed on the fourth semiconductor layer.

8. A semiconductor photoelectric conversion device according to claim 7, wherein the first and second semiconductor layers are composed of single-crystal semiconductor.

9. A semiconductor photoelectric conversion device according to claim 7, wherein the second conductive layer is transparent.

10. A semiconductor photoelectric conversion device comprising;

a substrate serving as a collector region, the substrate being composed of single-crystal semiconductor and having a first conductivity;

a first conductive layer serving as a collector electrode, the first conductive layer being formed on the first major surface of the substrate;

a first semiconductor layer serving as a base region, the first semiconductor layer being formed in the substrate on the side of the second major surface opposite from the first major surface and having a second conductivity type opposite from the first conductivity type;

a second semiconductor layer serving as a photo carrier generating region, the second semiconductor layer being formed on the first semiconductor layer, composed of non-single-crystal semiconductor and doped with a recombination center neutralizer and having an I conductivity type; and a second conductive layer serving as an emitter electrode, the second conductive layer being formed on the second semiconductor layer to make Schottky contact therewith.

11. A semiconductor photoelectric conversion device according to claim 10, wherein the first semiconductor layer is composed of single-crystal semiconductor.

12. A semiconductor photoelectric conversion device according to claim 10, wherein the second conductive layer is transparent.

13. A semiconductor photoelectric conversion device comprising:

a substrate serving as a part of a collector region, the substrate being composed of single-crystal semiconductor and having a first conductivity;

a first semiconductor layer serving as the other part of the collector region, the first semiconductor layer being formed on the first major surface of the substrate and having the first conductivity type but higher in impurity concentration than the substrate;

a first conductive layer serving as a collector electrode, the first conductive layer being formed on the underside of the first semiconductor layer;

a second semiconductor layer serving as a base region, the second semiconductor layer being formed in the substrate on the side of the second major surface opposite from the first major surface and having a second conductivity type opposite from the first conductivity type;

a third semiconductor layer serving as a photo carrier generating region, the third semiconductor layer being formed on the second semiconductor layer, composed of non-single-crystal semiconductor and doped with a recombination center neutralizer and having an I conductivity type; and a second conductive layer serving as an emitter electrode, the second conductive layer being formed on the third semiconductor layer to make Schottky contact therewith.

14. A semiconductor photoelectric conversion device according to claim 13, wherein the first and second semiconductor layers are composed of single-crystal semiconductor.

15. A semiconductor photoelectric conversion device according to claim 13, wherein the second conductive layer is transparent.

16. A semiconductor photoelectric conversion device comprising;

a substrate serving as a part of a collector region, the substrate being composed of single-crystal semiconductor and having an I conductivity;

a first semiconductor layer serving as the other part of the collector region, the first semiconductor layer being formed on the first major surface of the substrate and having a first conductivity type;

a first conductive layer serving as a collector electrode, the first conductive layer being formed on the underside of the first semiconductor layer;

a second semiconductor layer serving as a base region, the second semiconductor layer being formed in the substrate on the side of the second major surface opposite from the first major surface and having a second conductivity type opposite from the first conductivity type;

a third semiconductor layer serving as a photo carrier generating region, the third semiconductor layer being formed on the second semiconductor layer, composed of non-single-crystal semiconductor and doped with a recombination center neutralizer and having the I conductivity type; and a second conductive layer serving as an emitter electrode, the second conductive layer being formed on the third semiconductor layer to make Schottky contact therewith.

17. A semiconductor photoelectric conversion device according to claim 16, wherein the first and second semiconductor layers are composed of single-crystal semiconductor.

18. A semiconductor photoelectric conversion device according to claim 16, wherein the second conductive layer is transparent.

19. A semiconductor photoelectric conversion device comprising;

a substrate serving as a collector region, the substrate being composed of single-crystal semiconductor and having a first conductivity;

a first conductive layer serving as a collector electrode, the first conductive layer being formed on the first major surface of the substrate;

a first semiconductive layer serving as a base region, the first semiconductor layer being formed in the substrate on the side of the second major surface opposite from the first major surface and having a second conductivity type opposite from the first conductivity type;

a second semiconductor layer serving as a photo carrier generating region, the second semiconductor layer being formed on the first semiconductor layer, composed of non-single-crystal semiconductor and doped with a recombination center neutralizer and having an I conductivity type; and a second conductive layer serving as an emitter electrode, the second conductive layer being formed on the second semiconductor layer through a barrier layer.

20. A semiconductor photoelectric conversion device according to claim 19, wherein the first semiconductor layer is composed of single-crystal semiconductor.

21. A semiconductor photoelectric conversion device according to claim 19, wherein the second conductive layer is transparent.

22. A semiconductor photoelectric conversion device comprising;

a substrate serving as a part of a collector region, the substrate being composed of single-crystal semiconductor and having a first conductivity;

a first semiconductor layer serving as the other part of the collector region, the first semiconductor layer being formed on the first major surface of the substrate and having the first conductivity type but higher in impurity concentration than the substrate;

a first conductive layer serving as a collector electrode, the first conductive layer being formed on the underside of the first semiconductor layer;

a second semiconductor layer serving as a base region, the second semiconductor layer being formed in the substrate on the side of the second major surface opposite from the first major surface and having a second conductivity type opposite from the first conductivity type;

a third semiconductor layer serving as a photo carrier generating region, the third semiconductor layer being formed on the second semiconductor layer, composed of non-single-crystal semiconductor and doped with a recombination center neutralizer and having an I conductivity type; and a second conductive layer serving as an emitter electrode, the second conductive layer being formed on the fourth semiconductor layer through a barrier layer.

23. A semiconductor photoelectric conversion device according to claim 22, wherein the first and second semiconductor layers are composed of single-crystal semiconductor.

24. A semiconductor photoelectric conversion device according to claim 22, wherein the second conductive layer is transparent.

25. A semiconductor photoelectric conversion device comprising; .

a substrate serving as a part of a collector region, the substrate being composed of single-crystal semiconductor and having an I conductivity;

a first semiconductor layer serving as the other part of the collector region, the first semiconductor layer being formed on the first major surface of the substrate and having a first conductivity type;

a first conductive layer serving as a collector electrode, the first conductive layer being formed on the underside of the first semiconductor layer;

a second semiconductor layer serving as a base region, the second semiconductor layer being formed in the substrate on the side of the second major surface opposite from the first major surface and having a second conductivity type opposite from the first conductivity type;

a third semiconductor layer serving as a photo carrier generating region, the third semiconductor layer being formed on the second semiconductor layer, composed of non-single-crystal semiconductor and doped with a recombination center neutralizer and having the I conductivity type; and a second conductive layer serving as an emitter electrode, the second conductive layer being formed on the third semiconductor layer through a barrier layer.

26. A semiconductor photoelectric conversion device according to claim 24, wherein the first and second semiconductor layers are composed of single-crystal semiconductor.

27. A semiconductor photoelectric conversion device according to claim 25, wherein the second conductive layer is transparent.

28. A semiconductor photoelectric conversion device comprising;

a substrate serving as a collector region, the substrate being composed of single-crystal semiconductor and having a first conductivity;

a first conductive layer serving as a collector electrode, the first conductive layer being formed on the first major surface of the substrate;

a plurality of first semiconductor layers each serving as a base region, each of the first semiconductor layers being formed in the substrate on the side of the second major surface opposite from the first major surface and having a second conductivity type opposite from the first conductivity type;

a plurality of second semiconductor layers each serving as a photo carrier generating region, each of the second semiconductor layers being formed on one of the plurality of first semiconductor layers, composed of non-single-crystal semiconductor and doped with a recombination center neutralizer and having an I conductivity type;

a plurality of third semiconductor layers each serving as an emitter region, each of the third semiconductor layers being formed on one of the plurality of second semiconductor layers and composed of non-single-crystal semiconductor and having the first conductivity type; and a plurality of second conductive layers each serving as an emitter electrode, each of the second conductive layers being formed on one of the plurality of third semiconductor layers.

29. A semiconductor photoelectric conversion device according to claim 28, wherein the first semiconductor layers are composed of single-crystal semiconductor.

30. A semiconductor of photoelectric conversion device according to claim 28, wherein the second conductive layers are transparent.

31. A semiconductor photoelectric conversion device comprising; 'a substrate serving as a part of a collector region, the substrate being composed of single-crystal semiconductor and having a first conductivity;

a first semiconductor layer serving as the other part of the collector region, the first semiconductor layer being formed on the first major surface of the substrate and having the first conductivity type but higher in impurity concentration than the substrate;

a first conductive layer serving as a collector electrode, the first conductive layer being formed on the underside of the first semiconductor layer;

a plurality of second semiconductor layers each serving as a base region, each of the second semiconductor layers being formed in the substrate on the side of the second major surface opposite from the first major surface and having a second conductivity type opposite from the first conductivity type;

a plurality of third semiconductor layers each serving as a photo carrier generating region, each of the third semiconductor layers being formed on one of the plurality of second semiconductor layers, composed of non-single-crystal semiconductor and doped with a recombination center neutralizer and having an I conductivity type;

a plurality of fourth semiconductor layers each serving as an emitter region, each of the fourth semiconductor layers being formed on one of the plurality of third semiconductor layers and composed of non-single-crystal semiconductor and having the first conductivity type; and a plurality of second conductive layers each serving as an emitter electrode, each of the second conductive layers being formed on one of the plurality of fourth semiconductor layers.

32. A semiconductor photoelectric conversion device according to claim 31, wherein the first and second semiconductor layers are composed of single-crystal semiconductor.

33. A semiconductor photoelectric conversion device according to claim 31, wherein the second conductive layers are transparent.

34. A semiconductor photoelectric conversion device comprising;

a substrate serving as a part of a collector region, the substrate being composed of single-crystal semiconductor and having an I conductivity;

a first semiconductor layer serving as the other part of the collector region, the first semiconductor layer being formed on the first major surface of the substrate and having a first conductivity type;

a first conductive layer serving as a collector electrode, the first conductive layer being formed on the underside of the first semiconductor layer;

a plurality of second semiconductor layers each serving as a base region, each of the second semiconductor layers being formed in the substrate on the side of the second major surface opposite from the first major surface and having a second conductivity type opposite from the first conductivity type;

a plurality of third semiconductor layers each serving as a photo carrier generating region, each of the third semiconductor layers being formed on one of the plurality of second semiconductor layer, composed of non-single-crystal semiconductor and doped with a recombination center neutralizer and having the I conductivity type;

a plurality of fourth semiconductor layers each servng as an emitter region, each of the fourth semiconductor layers being formed on one of the plurality of third semiconductor layers and composed of non-single-crystal semiconductor and having the first conductivity type; and a plurality of second conductive layers each serving as an emitter electrode, each of the second conductive layers being formed on one of the plurality of fourth semiconductor layers.

35. A semiconductor photoelectric conversion device according to claim 34, wherein the first and second semiconductor layers are composed of single-crystal semiconductor.

36. A semiconductor photoelectric conversion device according to claim 34, wherein the second conductive layers are transparent.

37. A semiconductor photoelectric conversion device comprising;

a substrate serving as a collector region, the substrate being composed of single-crystal semiconductor and having a first conductivity;

a first conductive layer serving as a collector electrode, the first conductive layer being formed on the first major surface of the substrate;

a plurality of first semiconductor layers each serving as a base region, each of the first semiconductor layers being formed in the substrate on the side of the second major surface opposite from the first major surface and having a second conductivity type opposite from the first conductivity type;

a plurality of second semiconductor layers each serving as a photo carrier generating region, each of the second semiconductor layers being formed on one of the plurality of first semiconductor layers, composed of non-single-crystal semiconductor and doped with a recombination center neutralizer and having an I conductivity type; and a plurality of second conductive layers each serving as an emitter electrode, each of the second conductive layers being formed on one of the plurality of second semiconductor layers to make Schottky contact therewith.

38. A semiconductor photoelectric conversion device according to claim 37, wherein the first semiconductor layers are composed of single-crystal semiconductor.

39. A semiconductor photoelectric conversion device according to claim 37, wherein the second conductive layers are transparent.

40. A semiconductor photoelectric conversion device comprising;
   a substrate serving as a part of a collector region, the substrate being composed of single-crystal semiconductor and having a first conductivity;
   a first semiconductor layer serving as the other part of the collector region, the first semiconductor layer being formed on the first major surface of the substrate and having the first conductivity type but higher in impurity concentration than the substrate;
   a first conductive layer serving as a collector electrode, the first conductive layer being formed on the underside of the first semiconductor layer;
   a plurality of second semiconductor layers each serving as a base region, each of the second semiconductor layers being formed in the substrate on the side of the second major surface opposite from the first major surface and having a second conductivity type opposite from the first conductivity type;
   a plurality of third semiconductor layers each serving as a photo carrier generating region, each of the third semiconductor layers being formed on one of the plurality of second semiconductor layers, composed of non-single-crystal semiconductor and doped with a recombination center neutralizer and having an I conductivity type; and
   a plurality of second conductive layers each serving as an emitter electrode, each of second conductive layers being formed on one of the plurality of third semiconductor layer to make Schottky contact therewith.

41. A semiconductor photoelectric conversion device according to claim 40, wherein the first and second semiconductor layers are composed of single-crystal semiconductor.

42. A semiconductor photoelectric conversion device according to claim 40, wherein the second conductive layers are transparent.

43. A semiconductor photoelectric conversion device comprising;
   a substrate serving as a part of a collector region, the substrate being composed of single-crystal semiconductor and having an I conductivity;
   a first semiconductor layer serving as the other part of the collector region, the first semiconductor layer being formed on the first major surface of the substrate and having a first conductivity type;
   a first conductive layer serving as a collector electrode, the first conductive layer being formed on the underside of the first semiconductor layer;
   a plurality of second semiconductor layers each serving as a base region, each of the second semiconductor layers being formed in the substrate on the side of the second major surface opposite from the first major surface and having a second conductivity type opposite from the first conductivity type;
   a plurality of third semiconductor layers each serving as a photo carrier generating region, each of the third semiconductor layers being formed on one of the plurality of second semiconductor layers, composed of non-single-crystal semiconductor and doped with a recombination center neutralizer and having the I conductivity type; and
   a plurality of second conductive layers each serving as an emitter electrode, each of the second conductive layers being formed on one of the plurality of third semiconductor layers to make Schottky contact therewith.

44. A semiconductor photoelectric conversion device according to claim 43, wherein the first and second semiconductor layers are composed of single-crystal semiconductor.

45. A semiconductor photoelectric conversion device according to claim 43, wherein the second conductive layers are transparent.

46. A semiconductor photoelectric conversion device comprising;
   a substrate serving as a collector region, the substrate being composed of single-crystal semiconductor and having a first conductivity;
   a first conductive layer serving as a collector electrode, the first conductive layer being formed on the first major surface of the substrate;
   a plurality of first semiconductor layers each serving as a base region, each of the first semiconductor layers being formed in the substrate on the side of the second major surface opposite from the first major surface and having a second conductivity type opposite from the first conductivity type;
   a plurality of second semiconductor layers each serving as a photo carrier generating region, each of the second semiconductor layers being formed on one of the plurality of first semiconductor layers, composed of non-single-crystal semiconductor and doped with a recombination center neutralizer and having an I conductivity type; and
   a plurality of second conductive layers each serving as an emitter electrode, each of the second conductive layers being formed on one of the plurality of second semiconductor layer through a barrier layer.

47. A semiconductor photoelectric conversion device according to claim 46, wherein the first semiconductor layers are composed of single-crystal semiconductor.

48. A semiconductor photoelectric conversion device according to claim 46, wherein the second conductive layers are transparent.

49. A semiconductor photoelectric conversion device comprising;
   a substrate serving as a part of a collector region, the substrate being composed of single-crystal semiconductor and having a first conductivity;
   a first semiconductor layer serving as the other part of the collector region, the first semiconductor layer being formed on the first major surface of the substrate and having the first conductivity type but higher in impurity concentration than the substrate;
   a first conductive layer serving as a collector electrode, the first conductive layer being formed on the underside of the first semiconductor layer;
   a plurality of second semiconductor layers each serving as a base region, each of the second semiconductor layer being formed in the substrate on the side of the second major surface opposite from the first major surface and having a second conductivity type opposite from the first conductivity type;

a plurality of third semiconductor layers each serving as a photo carrier generating region, each of the third semiconductor layers being formed on one of the plurality of second semiconductor layers, composed of non-single-crystal semiconductor and doped with a recombination center neutralizer and having an I conductivity type; and a plurality of second conductive layers each serving as an emitter electrode, each of the second conductive layers being formed on one of the plurality of third semiconductor layers through a barrier layer.

50. A semiconductor photoelectric conversion device according to claim 49, wherein the first and second semiconductor layers are composed of single-crystal semiconductor.

51. A semiconductor photoelectric conversion device according to claim 49, wherein the second conductive layers are transparent.

52. A semiconductor photoelectric conversion device comprising:

a substrate serving as a part of a collector region, the substrate being composed of single-crystal semiconductor and having an I conductivity;

a first semiconductor layer serving as the other part of the collector region, the first semiconductor layer being formed on the first major surface of the substrate and having a first conductivity type;

a first conductive layer serving as a collector electrode, the first conductive layer being formed on the underside of the first semiconductor layer;

a plurality of second semiconductor layers each serving as a base region, each of the second semiconductor layers being formed in the substrate on the side of the second major surface opposite from the first major surface and having a second conductivity type opposite from the first conductivity type;

a plurality of third semiconductor layers each serving as a photo carrier generating region, each of the third semiconductor layers being formed on one of the plurality of second semiconductor layers, composed of non-single-crystal semiconductor and doped with a recombination center neutralizer and having the I conductivity type; and a plurality of second conductive layers each serving as an emitter electrode, each of the second conductive layers being formed on one of the plurality of third semiconductor layers through a barrier layer.

53. A semiconductor photoelectric conversion device according to claim 52, wherein the first and second semiconductor layers ae composed of single-crystal semiconductor.

54. A semiconductor photoelectric converstion device according to claim 52, wherein the second conductive layers are transparent.

55. A semiconductor photoelectric conversion device comprising;

a substrate composed of single-crystal semiconductor and having a first conductivity;

a plurality of first semiconductor layers each serving as a collector region a collector electrode connected to said collector region, each of the first semiconductor layers being formed in the substrate on the side of the major surface thereof and having a second conductivity type opposite from the first conductivity type;

a plurality of second semiconductor layers each serving as a base region, each of the second semiconductor layers being formed on one of the plurality of first semiconductor layers and having the first conductivity type;

a plurality of third semiconductor layers each serving as a photo carrier generating region, each of the third semiconductor layers being formed on one of the plurality of second semiconductor layers, composed of non-single-crystal semiconductor and doped with a recombination center neutralizer and having an I conductivity type;

a plurality of fourth semiconductor layers each serving as an emitter region, each of the fourth semiconductor layers being formed on one of the plurality of third semiconductor layers and composed of non-single-crystal semiconductor and having the second conductivity type; and a plurality of conductive layers each serving as an emitter electrode, each of the conductive layers being formed on one of the plurality of fourth semiconductor layer.

56. A semiconductor photoelectric conversion device according to claim 55, wherein the first and second semiconductor layers are composed of single-crystal semiconductor.

57. A semiconductor photoelectric conversion device according to claim 55, wherein the conductive layers are transparent.

58. A semiconductor photoelectric conversion device comprising;

a substrate composed of single-crystal semiconductor and having a first conductivity;

a plurality of first semiconductor layers each serving as a part of a collector region a collector electrode connected to said collector region, each of the first semiconductor layers being formed in the substrate on the side of the major surface thereof and having a second conductivity type opposite from the first conductivity type;

a plurality of second semiconductor layers each serving as the other of the collector region, each of the second semiconductor layers being formed on one of the plurality of first semiconductor layers and having the second conductivity type but lower in impurity concentration than the first semiconductor layer;

a plurality of third semiconductor layers each serving as a base region, each of the third semiconductor layers being formed on one of the plurality of second semiconductor layers and having the first conductivity type;

a plurality of fourth semiconductor layers each serving as a photo carrier generating region, each of the fourth semiconductor layers being formed on one of the plurality of third semiconductor layers, composed of non-single-crystal semiconductor and doped with a recombination center neutralizer and having an I conductivity type;

a plurality of fifth semiconductor layers each serving as an emitter region, each of the fifth semiconductor layers being formed on one of the plurality of fourth semiconductor layers and composed of non-single-crystal semiconductor and having the second conductivity type; and a plurality of conductive layers each serving as an emitter electrode, each of the conductive layers being formed on one of the plurality of fifth semiconductor layers.

59. A semiconductor photoelectric conversion device according to claim 58, wherein the first, second and third semiconductor layers are composed of single-crystal semiconductor.

60. A semiconductor photoelectric conversion device according to claim 58, wherein the conductive layers are transparent.

61. A semiconductor photoelectric conversion device comprising;
   a substrate composed of single-crystal semiconductor and having a first conductivity;
   a plurality of first semiconductor layers serving as a part of a collector region a collector electrode connected to said collector region, each of the first semiconductor layers being formed in the substrate on the side of the major surface thereof and having a second conductivity type opposite from the first conductivity type;
   a plurality of second semiconductor layers each serving as the other part of the collector region, each of the second semiconductor layers being formed on one of the plurality of first semiconductor layers and having the an I conductivity type;
   a plurality of third semiconductor layers each serving as a base region, each of the third semiconductor layers being formed on one of the plurality of second semiconductor layers and having the first conductivity type;
   a plurality of fourth semiconductor layers each serving as a photo carrier generating region, each of the fourth semiconductor layers being formed on one of the plurality of third semiconductor layers, composed of a non-single-crystal semiconductor and doped with a recombination center neutralizer and having the I conductivity type;
   a plurality of fifth semiconductor layers each serving as an emitter region, each of the fifth semiconductor layers being formed on one of the plurality of fourth semiconductor layers and composed of non-single-crystal semiconductor and having the second conductivity type; and
   a plurality of conductive layers each serving as an emitter electrode, each of the conductive layers being formed on one of the plurality of fifth semiconductor layers.

62. A semiconductor photoelectric conversion device according to claim 61, wherein the first, second and third semiconductor layers are composed of single-crystal semiconductor.

63. A semiconductor photoelectric conversion device according to claim 61, wherein the conductive layers are transparent.

64. A semiconductor photoelectric conversion device comprising;
   a substrate composed of single-crystal semiconductor and having a first conductivity;
   a plurality of first semiconductor layers each serving as a collector region a collector electrode connected to said collector region, each of the first semiconductor layers being formed in the substrate on the side of the major surface thereof and having a second conductivity type opposite from the first conductivity type;
   a plurality of second semiconductor layers each serving as a base region, each of the second semiconductor layers being formed on one of the plurality of first semiconductor layers and having the first conductivity type;
   a plurality of third semiconductor layers each serving as a photo carrier generating region, each of the third semiconductor layers being formed on one of the plurality of second semiconductor layers, composed of non-single-crystal semiconductor and doped with a recombination center neutralizer and having an I conductivity type; and
   a plurality of conductive layers each serving as an emitter electrode, each of the conductive layers being formed on one of the plurality of third semiconductor layer to make Schottky contact therewith.

65. A semiconductor photoelectric conversion device according to claim 64, wherein the first and second semiconductor layers are composed of single-crystal semiconductor.

66. A semiconductor photoelectric conversion device according to claim 64, wherein the conductive layers are transparent.

67. A semiconductor photoelectric conversion device comprising;
   a substrate composed of single-crystal semiconductor and having a first conductivity;
   a plurality of first semiconductor layers each serving as a part of a collector region a collector electrode connected to said collector region, each of the first semiconductor layers being formed in the substrate on the side of the major surface thereof and having a second conductivity type opposite from the first conductivity type;
   a plurality of second semiconductor layers each serving as the other of the collector region, each of the second semiconductor layers being formed on one of the plurality of first semiconductor layers and having the second conductivity type but lower in impurity concentration than the first semiconductor layer;
   a plurality of third semiconductor layers each serving as a base region, each of the third semiconductor layers being formed on one of the plurality of second semiconductor layers and having the first conductivity type;
   a plurality of fourth semiconductor layers each serving as a photo carrier generating region, each of the fourth semiconductor layers being formed on one of the plurality of third semiconductor layers, composed of non-single-crystal semiconductor and doped with a recombination center neutralizer and having an I conductivity type; and
   a plurality of conductive layers each serving as an emitter electrode, each of the conductive layers being formed on one of the plurality of fourth semiconductor layers to make Schottky contact therewith.

68. A semiconductor photoelectric conversion device according to claim 67, wherein the first, second and third semiconductor layers are composed of single-crystal semiconductor.

69. A semiconductor photoelectric conversion device according to claim 67, wherein the conductive layers are transparent.

70. A semiconductor photoelectric conversion device comprising;
   a substrate composed of single-crystal semiconductor and having a first conductivity;

a plurality of first semicondcutor layers serving as a part of a collector region a collector electrode connected to said collector region, each of the first semiconductor layers being formed in the substrate on the side of the major surface thereof and having a second conductivity type opposite from the first conductivity type;

a plurality of second semiconductor layers each serving as the other part of the collector region, each of the second semiconductor layers being formed on one of the plurality of first semiconductor layers and having an I conductivity type;

a plurality of third semiconductor layers each serving as a base region, each of the third semiconductor layers being formed on one of the plurality of second semiconductor layers and having the first conductivity type;

a plurality of fourth semiconductor layers each serving as a photo carrier generating region, each of the fourth semiconductor layers being formed on one of the plurality of third semiconductor layers, composed of non-single-crystal semiconductor and doped with a recombination center neutralizer and having the I conductivity type; and a plurality of conductive layers each serving as an emitter electrode, each of the conductive layers being formed on one of the plurality of fourth semiconductor layers to make Schottky contact therewith.

71. A semiconductor photoelectric conversion device according to claim 70, wherein the first, second and third semiconductor layers are composed of single-crystal semiconductor.

72. A semiconductor photoelectric conversion device according to claim 70, wherein the conductive layers are transparent.

73. A semiconductor photoelectric conversion device comprising;

a substrate composed of single-crystal semiconductor and having a first conductivity;

a plurality of first semiconductor layers each serving as a collector region a collector electrode connected to said collector region, each of the first semiconductor layers being formed in the substrate on the side of the major surface thereof and having a second conductivity type opposite from the first conductivity type;

a plurality of second semiconductor layers each serving as a base region, each of the second semiconductor layers being formed on one of the plurality of first semiconductor layers and having the first conductivity type;

a plurality of third semiconductor layers each serving as a photo carrier generating region, each of the third semiconductor layers being formed on one of the plurality of second semiconductor layers, composed of non-single-crystal semiconductor and doped with a recombination center neutralizer and having an I conductivity type; and a plurality of conductive layers each serving as an emitter electrode, each of the conductive layers being formed on one of the plurality of third semiconductor layer through a barrier layer.

74. A semiconductor photoelectric conversion device according to claim 73, wherein the first and second semiconductor layers are composed of single-crystal semiconductor.

75. A semiconductor photoelectric conversion device according to claim 73, wherein the conductive layers are transparent.

76. A semiconductor photoelectric conversion device comprising;

a substrate composed of single-crystal semiconductor and having a first conductivity;

a plurality of first semiconductor layers each serving as a part of a collector region a collector electrode connected to said collector region, each of the first semiconductor layers being formed in the substrate on the side of the major surface thereof and having a second conductivity type opposite from the first conductivity type;

a plurality of second semiconductor layers each serving as the other of the collector region, each of the second semiconductor layers being formd on one of the plurality of first semiconductor layers and having the second conductivity type but lower in impurity concentration than the first semiconductor layer;

a plurality of third semiconductor layers each serving as a base region, each of the third semiconductor layers being formed on one of the plurality of second semiconductor layers and having the first conductivity type;

a plurality of fourth semiconductor layers each serving as a photo carrier generating region, each of the fourth semiconductor layers being formed on one of the plurality of third semiconductor layers, composed of non-single-crystal semiconductor and doped with a recombination center neutralizer and having an I conductivity type; and a plurality of conductive layers each serving as an emitter electrode, each of the conductive layers being formed on one of the plurality of fourth semiconductor layers.

77. A semiconductor photoelectric conversion device according to claim 76, wherein the first, second and third semiconductor layers are composed of single-crystal semiconductor.

78. A semiconductor photoelectric conversion device according to claim 76, wherein the conductive layers are transparent.

79. A semiconductor photoelectric conversion device comprising;

a substrate composed of single-crystal semiconductor and having a first conductivity;

a plurality of first semiconductor layers serving as a part of a collector region a collector electrode connected to said collector region, each of the first semiconductor layers being formed in the substrate on the side of the major surface thereof and having a second conductivity type opposite from the first conductivity type;

a plurality of second semiconductor layers each serving as the other part of the collector region, each of the second semiconductor layers being formed on one of the plurality of first semiconductor layers and having an I conductivity type;

a plurality of third semiconductor layers each serving as a base region, each of the third semiconductor layers being formed on one of the plurality of second semiconductor layers and having the first conductivity type;

a plurality of fourth semiconductor layers each serving as a photo carrier generating region, each of the fourth semiconductor layers being formed on one of the plurality of third semiconductor layers, composed of non-single-crystal semiconductor and doped with a recombination center neutralizer and having the I conductivity type; and a plurality of conductive layers each serving as an emitter electrode, each of the conductive layers being formed on one of the plurality of fourth semiconductor layers through a barrier layer.

80. A semiconductor photoelectric conversion device according to claim 79, wherein the first, second and third semiconductor layers are composed of single-crystal semiconductor.

81. A semiconductor photoelectric conversion device according to claim 79, wherein the conductive layers are transparent.

82. A semiconductor photoelectric conversion device comprising;
   a substrate composed of single-crystal semiconductor and having a first conductivity;
   a plurality m of first semiconductor layers $Q_1$ to $Q_m$ each serving as a collector region a collector electrode connected to said collector region, the first semiconductor layers $Q_1$ to $Q_m$ being formed in the substrate to extend therein in a first direction on the side of the major surface thereof and sequentially arranged in a second direction intersecting the first direction and having a second conductivity type opposite from the first conductivity type;
   a plurality m×n (where n is an integer larger than one) of second semiconductor layers $R_{11}$ to $R_{1n}$, $R_{21}$ to $R_{2n}$ ... $R_{m1}$ to $R_{mn}$ each serving as a base region, the second semiconductor layers $R_{i1}$ to $R_{in}$ (i=1, 2, 3, ... m) being formed on the first semiconductor layer $Q_i$ and sequentially arranged in the first direction and having the first conductivity type;
   a plurality n of third semiconductor layers $U_1$ to $U_n$ each serving as a photo carrier generating region, the third semiconductor layer $U_j$ (j=1, 2 ... n) being formed on the substrate to extend in the second direction in contact with the second semiconductor layers, $R_{1j}$ to $R_{mj}$, composed of non-single-crystal semiconductor and doped with a recombination center neutralizer and having an I conductivity type;
   a plurality n of fourth semiconductor layer $W_1$ to $W_n$ each serving as an emitter region, the fourth semiconductor layer $W_j$ being formed on the third semiconductor layer $U_j$ in opposing relation to the second semiconductor layers $R_{1j}$ to $R_{mj}$ and composed of non-single-crystal semiconductor and having the second conductivity type; and
   a plurality n of conductive layers $B_1$ to $B_n$ each serving as an emitter electrode, the conductive layer $B_j$ being formed on the fourth semiconductor layer $W_j$ in opposing relation to the second semiconductor layers $R_{1j}$ to $R_{mj}$.

83. A semiconductor photoelectric conversion device according to claim 82, wherein the first semiconductor layer $Q_i$ and the second semiconductor layer $R_{ij}$ are composed of single-crystal semiconductor.

84. A semiconductor photoelectric conversion device according to claim 82, wherein the conductive layer $B_j$ is transparent.

85. A semiconductor photoelectric conversion device comprising;
   a substrate composed of single-crystal semiconductor and having a first conductivity;
   a plurality m of first semiconductor layer $Q_1'$ to $Q_m'$ each serving as a part of a collector region a collector electrode connected to said collector region, the first semiconductor layers $Q_1'$ to $Q_m'$ being formed in the substrate to extend therein in a first direction on the side of the major surface thereof and sequentially arranged in a second direction intersecting the first direction and having a second conductivity type opposite from the first conductivity type;
   a plurality m of second semiconductor layers $Q_1$ to $Q_m$ each serving as the other part of the collector region, the second semiconductor layer $Q_i$ (i=1, 2 ... m) being formed on the first semiconductor layer $Q_i'$ and having the second conductivity type but lower in impurity concentration than the first semiconductor layer $Q_i'$;
   a plurality m×n (where n is an integer larger than one) of third semiconductor layers $R_{11}$ to $R_{1n}$, $R_{21}$ to $R_{2n}$ ... $R_{m1}$ to $R_{mn}$ each serving as a base region, the third semiconductor layers $R_{i1}$ to $R_{in}$ being formed on the first semiconductor layer $Q_i$ and sequentially arranged in the first direction and having the first conductivity type;
   a plurality n of fourth semiconductor layers $U_1$ to $U_n$ each serving as a photo carrier generating region, the fourth semiconductor layers $U_j$ (j=1, 2, 3, ... n) being formed on the substrate to extend in the second direction in contact with the third semiconductor layers $R_{1j}$ to $R_{mj}$, composed of non-single-crystal semiconductor and doped with a recombination center neutralizer and having an I conductivity type;
   a plurality n of fifth semiconductor layers $W_1$ to $W_n$ each serving as an emitter region, the fifth semiconductor layers $W_j$ being formed on the fourth semiconductor layers $U_j$ in opposing relation to the second semiconductor layers $R_{1j}$ to $R_{mj}$ and composed of non-single-crystal semiconductor and having the second conductivity type; and
   a plurality n of conductive layers $B_1$ to $B_n$ each serving as an emitter electrode, the conductive layer $B_j$ being formed on the fifth semiconductor layer $W_j$ in opposing relation to the second semiconductor layers $R_{1j}$ to $R_{mj}$.

86. A semiconductor photoelectric conversion device according to claim 85, wherein the first semiconductor layer $Q_i'$, second semiconductor layers $Q_i$ and third semiconductor layer $R_{ij}$ are composed of single-crystal semiconductor.

87. A semiconductor photoelectric conversion device according to claim 85, wherein the conductive layer $B_j$ is transparent.

88. A semiconductor photoelectric conversion device comprising;
   a substrate composed of single-crystal semiconductor and having a first conductivity;
   a plurality m of first semiconductor layer $Q_1'$ to $Q_m'$ each serving as a part of a collector region a collector electrode connected to said collector region, the first semiconductor layers $Q_1'$ to $Q_m'$ being formed in the substrate to extend therein in a first direction on the side of the major surface thereof and sequentially arranged in a second direction intersecting the first direction and having a second conductivity type opposite from the first conductivity type;

a plurality m of second semiconductor layers $Q_1$ to $Q_m$ each serving as the other part of the collector region, the second semiconductor layer $Q_i$ (i=1, 2 ... m) being formed on the first semiconductor layer $Q_i'$ and having an I conductivity type;

a plurality m×n (where n is an integer larger than one) of third semiconductor layers $R_{11}$ to $R_{1n}$, $R_{21}$ to $R_{2n}$ ... $R_{m1}$ to $R_{mn}$ each serving as a base region, the third semiconductor layers $R_{i1}$ to $R_{in}$ being formed on the first semiconductor layer $Q_i$ and sequentially arranged in the first direction and having the first conductivity type;

a plurality n of fourth semiconductor layers $U_1$ to $U_n$ each serving as a photo carrier generating region, the fourth semiconductor layers $U_j$ (j=1, 2, 3, ... n) being formed on the substrate to extend in the second direction in contact with the third semiconductor layers $R_{1j}$ to $R_{mj}$, composed of non-single-crystal semiconductor and doped with a recombination center neutralizer and having an I conductivity type;

a plurality n of fifth semiconductor layers $W_1$ to $W_n$ each serving as an emitter region, the fifth semiconductor layers $W_j$ being formed on the fourth semiconductor layers $U_j$ in opposing relation to the second semiconductor layers $R_{1j}$ to $R_{mj}$ and composed of non-single-crystal semiconductor and having the second conductivity type; and a plurality n of conductive layers $B_1$ to $B_n$ each serving as an emitter electrode, the conductive layer $B_j$ being formed on the fifth semiconductor layer $W_j$ in opposing relation to the second semiconductor layers $R_{1j}$ to $R_{mj}$.

89. A semiconductor photoelectric conversion device according to claim 88, wherein the first semiconductor layer $Q_i'$, second semiconductor layers $Q_i$ and third semiconductor layer $R_{ij}$ are composed of single-crystal semiconductor.

90. A semiconductor photoelectric conversion device according to claim 88, wherein the conductive layer $B_j$ is transparent.

91. A semiconductor photoelectric conversion device comprising;

a substrate composed of single-crystal semiconductor and having a first conductivity;

a plurality m of first semiconductor layers $Q_1$ to $Q_m$ each serving as a collector region a collector electrode connected to said collector region, the first semiconductor layers $Q_1$ to $Q_m$ being formed in the substrate to extend therein in a first direction on the side of the major surface thereof and sequentially arranged in a second direction intersecting the first direction and having a second conductivity type opposite from the first conductivity type;

a plurality m×n (where n is an integer larger than one) of second semiconductor layers $R_{11}$ to $R_{1n}$, $R_{21}$ to $R_{2n}$ ... $R_{m1}$ to $R_{mn}$ each serving as a base region, the second semiconductor layers $R_{i1}$ to $R_{in}$ (i=1, 2, 3, ... m) being formed on the first semiconductor layer $Q_i$ and sequentially arranged in the first direction and having the first conductivity type;

a plurality n of third semiconductor layers $U_1$ to $U_n$ each serving as a photo carrier generating region, the third semiconductor layer $U_j$ (j=1, 2 ... n) being formed on the substrate to extend in the second direction in contact with the second semiconductor layers, $R_{1j}$ to $R_{mj}$, composed of non-single-crystal semiconductor and doped with a recombination center neutralizer and having an I conductivity type; and a plurality n of conductive layers $B_1$ to $B_n$ each serving as an emitter electrode, the conductive layer $B_j$ being formed on the third semiconductor layer $U_j$ in opposing relation to the second semiconductor layers $R_{1j}$ to $R_{mj}$ to make Schottky contact therewith.

92. A semiconductor photoelectric conversion device according to claim 91, wherein the first semiconductor layer $Q_i$ and the second semiconductor layer $R_{ij}$ are composed of single-crystal semiconductor.

93. A semiconductor photoelectric conversion device according to claim 91, wherein the conductive layer $B_j$ is transparent.

94. A semiconductor photoelectric conversion device comprising;

a substrate composed of single-crystal semiconductor and having a first conductivity;

a plurality m of first semiconductor layer $Q_1'$ to $Q_m'$ each serving as a part of a collector region a collector electrode connected to said collector region, the first semiconductor layers $Q_1'$ to $Q_m'$ being formed in the substrate to extend therein in a first direction on the side of the major surface thereof and sequentially arranged in a second direction intersecting the first direction and having a second conductivity type opposite from the first conductivity type;

a plurality m of second semiconductor layers $Q_1$ to $Q_m$ each serving as the other part of the collector region, the second semiconductor layer $Q_i$ (i=1, 2 ... m) being formed on the first semiconductor layer $Q_i'$ and having the second conductivity type but lower in impurity concentration than the first semiconductor layer $Q_i'$;

a plurality m×n (where n is an integer larger than one) of third semiconductor layers $R_{11}$ to $R_{1n}$, $R_{21}$ to $R_{2n}$ ... $R_{m1}$ to $R_{mn}$ each serving as a base region, the third semiconductor layers $R_{i1}$ to $R_{in}$ being formed on the first semiconductor layer $Q_i$ and sequentially arranged in the first direction and having the first conductivity type;

a plurality n of fourth semiconductor layers $U_1$ to $U_n$ each serving as a photo carrier generating region, the fourth semiconductor layers $U_j$ (j=1, 2, 3, ... n) being formed on the substrate to extend in the second direction in contact with the third semiconductor layers $R_{1j}$ to $R_{mj}$, composed of non-single-crystal semiconductor and doped with a recombination center neutralizer and having an I conductivity type; and a plurality n of conductive layers $B_1$ to $B_n$ each serving as an emitter electrode, the conductive layer $B_j$ being formed on the fourth semiconductor layer $U_j$ in opposing relation to the second semiconductor layers $R_{1j}$ to $R_{mj}$ to make Schottky contact therewith.

95. A semiconductor photoelectric conversion device according to claim 94, wherein the first semiconductor layer $Q_i'$, second semiconductor layers $Q_i$ and third semiconductor layer $R_{ij}$ are composed of single-crystal semiconductor.

96. A semiconductor photoelectric conversion device according to claim 94, wherein the conductive layer $B_j$ is transparent.

97. A semiconductor photoelectric conversion device comprising;
- a substrate composed of single-crystal semiconductor and having a first conductivity;
- a plurality m of first semiconductor layer $Q_1'$ to $Q_m'$ each serving as a part of a collector region a collector electrode connected to said collector region, the first semiconductor layers $Q_1'$ to $Q_m'$ being formed in the substrate to extend therein in a first direction on the side of the major surface thereof and sequentially arranged in a second direction intersecting the first direction and having a second conductivity type opposite from the first conductivity type;
- a plurality m of second semiconductor layers $Q_1$ to $Q_m$ each serving as the other part of the collector region, the second semiconductor layer $Q_i$ ($i=1, 2 \ldots m$) being formed on the first semiconductor layer $Q_i'$ and having an I conductivity type;
- a plurality m×n (where n is an integer larger than one) of third semiconductor layers $R_{11}$ to $R_{1n}$, $R_{21}$ to $R_{2n} \ldots R_{m1}$ to $R_{mn}$ each serving as a base region, the third semiconductor layers $R_{i1}$ to $R_{in}$ being formed on the first semiconductor layer $Q_i$ and sequentially arranged in the first direction and having the first conductivity type;
- a plurality n of fourth semiconductor layers $U_1$ to $U_n$ each serving as a photo carrier generating region, the fourth semiconductor layers $U_j$ ($j=1, 2, 3, \ldots n$) being formed on the substrate to extend in the second direction in contact with the third semiconductor layers $R_{ij}$ to $R_{mj}$, composed of non-single-crystal semiconductor and doped with a recombination center neutralizer and having an I conductivity type; and
- a plurality n of conductive layers $B_1$ to $B_n$ each serving as an emitter electrode, the conductive layer $B_j$ being formed on the fourth semiconductor layer $U_j$ in opposing relation to the second semiconductor layers $R_{1j}$ to $R_{mj}$ to make Schottky contact therewith.

98. A semiconductor photoelectric conversion device according to claim 97, wherein the first semiconductor layer $Q_i'$, second semiconductor layers $Q_i$ and third semiconductor layer $R_{ij}$ are composed of single-crystal semiconductor.

99. A semiconductor photoelectric conversion device according to claim 97, wherein the conductive layer $B_j$ is transparent.

100. A semiconductor photoelectric conversion device comprising;
- a substrate composed of single-crystal semiconductor and having a first conductivity;
- a plurality m of first semiconductor layers $Q_1$ to $Q_m$ each serving as a collector region a collector electrode connected to said collector region, the first semiconductor layers $Q_1$ to $Q_m$ being formed in the substrate to extend therein in a first direction on the side of the major surface thereof and sequentially arranged in a second direction intersecting the first direction and having a second conductivity type opposite from the first conductivity type;
- a plurality m×n (where n is an integer larger than one) of second semiconductor layers $R_{11}$ to $R_{1n}$, $R_{21}$ to $R_{2n} \ldots R_{m1}$ to $R_{mn}$ each serving as a base region, the second semiconductor layers $R_{i1}$ to $R_{in}$ ($i=1, 2, 3, \ldots m$) being formed on the first semiconductor layer $Q_i$ and sequentially arranged in the first direction and having the first conductivity type;
- a plurality n of third semiconductor layers $U_1$ to $U_n$ each serving as a photo carrier generating region, the third semiconductor layer $U_j$ ($j=1, 2 \ldots n$) being formed on the substrate to extend in the second direction in contact with the second semiconductor layers $R_{1j}$ to $R_{mj}$, composed of non-single-crystal semiconductor and doped with a recombination center neutralizer and having an I conductivity type; and
- a plurality n of conductive layers $B_1$ to $B_n$ each serving as an emitter electrode, the conductive layer $B_j$ being formed on the third semiconductor layer $U_j$ in opposing relation to the second semiconductor layers $R_{1j}$ to $R_{mj}$ through a barrier layer.

101. A semiconductor photoelectric conversion device according to claim 100, wherein the first semiconductor layer $Q_i$ and the second semiconductor layer $R_{ij}$ are composed of single-crystal semiconductor.

102. A semiconductor photoelectric conversion device according to claim 100, wherein the conductive layer $B_j$ is transparent.

103. A semiconductor photoelectric conversion device comprising;
- a substrate composed of single-crystal semiconductor and having a first conductivity;
- a plurality m of first semiconductor layer $Q_1'$ to $Q_m'$ each serving as a part of a collector region a collector electrode connected to said collector region, the first semiconductor layers $Q_1'$ to $Q_m'$ being formed in the substrate to extend therein in a first direction on the side of the major surface thereof and sequentially arranged in a second direction intersecting the first direction and having a second conductivity type opposite from the first conductivity type;
- a plurality m of second semiconductor layers $Q_1$ to $Q_m$ each serving as the other part of the collector region, the second semiconductor layer $Q_i$ ($i=1, 2 \ldots m$) being formed on the first semiconductor layer $Q_i'$ and having the second conductivity type but lower in impurity concentration than the first semiconductor layer $Q_i'$;
- a plurality m×n (where n is an integer larger than one) of third semiconductor layers $R_{11}$ to $R_{1n}$, $R_{21}$ to $R_{2n} \ldots R_{m1}$ to $R_{mn}$ each serving as a base region, the third semiconductor layers $R_{i1}$ to $R_{in}$ being formed on the first semiconductor layer $Q_i$ and sequentially arranged in the first direction and having the first conductivity type;
- a plurality n of fourth semiconductor layers $U_1$ to $U_n$ each serving as a photo carrier generating region, the fourth semiconductor layers $U_j$ ($j=1, 2, 3, \ldots n$) being formed on the substrate to extend in the second direction in contact with the third semiconductor layers $R_{1j}$ to $R_{mj}$, composed of non-single-crystal semiconductor and doped with a recombination center neutralizer and having an I conductivity type; and
- a plurality n of conductive layers $B_1$ to $B_n$ each serving as an emitter electrode, the conductive layer $B_j$ being formed on the fourth semiconductor layer $U_j$ in opposing relation to the second semiconductor layers $R_{1j}$ to $R_{mj}$ through a barrier layer.

104. A semiconductor photoelectric conversion device according to claim 103, wherein the first semiconductor layer $Q_i'$, second semiconductor layers $Q_i$ and third semiconductor layer $R_{ij}$ are composed of single-crystal semiconductor.

105. A semiconductor photoelectric conversion device according to claim 103, wherein the conductive layer $B_j$ is transparent.

106. A semiconductor photoelectric conversion device comprising;
   a substrate composed of single-crystal semiconductor and having a first conductivity;
   a plurality m of first semiconductor layer $Q_1'$ to $Q_m'$ each serving as a part of a collector region a collector electrode connected to said collector region, the first semiconductor layers $Q_1'$ to $Q_m'$ being formed in the substrate to extend therein in a first direction on the side of the major surface thereof and sequentially arranged in a second direction intersecting the first direction and having a second conductivity type opposite from the first conductivity type;
   a plurality m of second semiconductor layers $Q_1$ to $Q_m$ each serving as the other part of the collector region, the second semiconductor layer $Q_i$ (i=1, 2 ... m) being formed on the first semiconductor layer $Q_i'$ and having an I conductivity type;
   a plurality m×n (where n is an integer larger than one) of third semiconductor layers $R_{11}$ to $R_{1n}$, $R_{21}$ to $R_{2n}$ ... $R_{m1}$ to $R_{mn}$ each serving as a base region, the third semiconductor layers $R_{i1}$ to $R_{in}$ being formed on the first semiconductor layer $Q_i$ and sequentially arranged in the first direction and having the first conductivity type;
   a plurality n of fourth semiconductor layers $U_1$ to $U_n$ each serving as a photo carrier generating region, the fourth semiconductor layers $U_j$(j=1, 2, 3, ... n) being formed on the substrate to extend in the second direction in contact with the third semiconductor layers $R_{1j}$ to $R_{mj}$, composed of non-single-crystal semiconductor and doped with a recombination center neutralizer and having an I conductivity type; and
   a plurality n of conductive layers $B_1$ to $B_n$ each serving as an emitter electrode, the conductive layer $B_j$ being formed on the fourth semiconductor layer $U_j$ in opposing relation to the second semiconductor layers $R_{1j}$ to $R_{mj}$ through a barrier layer.

107. A semiconductor photoelectric conversion device according to claim 106, wherein the first semiconductor layer $Q_i'$, second semiconductor layers $Q_i$ and third semiconductor layer $R_{ij}$ are composed of single-crystal semiconductor.

108. A semiconductor photoelectric conversion device according to claim 106, wherein the conductive layer $B_j$ is transparent.

109. A semiconductor photoelectric conversion device according to one of claims 1, 10, 19, 28, 37 and 46 wherein the second semiconductor layer or layers are formed of an amorphous or semi-amorphous semiconductor.

110. A semiconductor photoelectric conversion device according to one of claims 1 and 28, wherein the third semiconductor layer or layers have a larger energy gap than that of the second semiconductor layer or layers.

111. A semiconductor photoelectric conversion device according to one of claims 1 and 28, wherein the third semiconductor layer or layers are formed a micro-crystalline semiconductor.

112. A semiconductor photoelectric conversion device according to one of claims 1 and 28, wherein the second semiconductor layer or layers are formed an amorphous or semi-amorphous semiconductor, and wherein the third semiconductor layer or layers are formed a micro-crystalline semiconductor.

113. A semiconductor photoelectric conversion device according to one of claims 4, 7, 13, 16, 22, 25, 31, 34, 40, 43, 49 and 52, wherein the third semiconductor layer or layers are formed of an amorphous or semi-amorphous semiconductor.

114. A semiconductor photoelectric conversion device according to one of claims 4, 7, 31 and 34, wherein the fourth semiconductor layer or layers have a larger energy gap than that of the third semiconductor layer or layers.

115. A semiconductor photoelectric conversion device according to one of claims 4, 7, 31 and 34, wherein the fourth semiconductor layer or layers are formed a micro-crystalline semiconductor.

116. A semiconductor photoelectric conversion device according to one of claims 4, 7, 31 and 34, wherein the third semiconductor layer or layers are formed an amorphous or semi-amorphous semiconductor, and wherein the fourth semiconductor layer or layers are formed a micro-crystalline semiconductor.

117. A semiconductor photoelectric conversion device according to one of claims 55, 64, 73, 82, 91 and 100, wherein the third semiconductor layers are formed of an amorphous or semi-amorphous semiconductor.

118. A semiconductor photoelectric conversion device according to one of claims 55 and 82, wherein the fourth semiconductor layers have a larger energy gap than that of the third semiconductor layers.

119. A semiconductor photoelectric conversion device according to one of claims 55 and 82, wherein the fourth semiconductor layers are formed a micro-crystalline semiconductor.

120. A semiconductor photoelectric conversion device according to one of claims 55 and 82, wherein the third semiconductor layers are formed an amorphous or semi-amorphous semiconductor, and wherein the fourth semiconductor layers are formed a micro-crystalline semiconductor.

121. A semiconductor photoelectric conversion device according to one of claims 58, 61, 67, 70, 76, 79, 85, 88, 94, 97, 103 and 106, wherein the fourth semiconductor layers are formed of an amorphous or semi-amorphous semiconductor.

122. A semiconductor photoelectric conversion device according to one of claims 58, 61, 85 and 88, wherein the fifth semiconductor layers have a larger energy gap than that of the fourth semiconductor layers.

123. A semiconductor photoelectric conversion device according to one of claims 58, 61, 85 and 88, wherein the fifth semiconductor layers are formed a micro-crystalline semiconductor.

124. A semiconductor photoelectric conversion device according to one of claims 58, 61, 85 and 88, wherein the fourth semiconductor layers are formed an amorphous or semi-amorphous semiconductor, and wherein the fifth semiconductor layers are formed a micro-crystalline semiconductor.

* * * * *